United States Patent
Yu et al.

(10) Patent No.: US 10,371,893 B2
(45) Date of Patent: Aug. 6, 2019

(54) HYBRID INTERCONNECT DEVICE AND METHOD

(71) Applicant: Taiwan Semiconductor Manufacturing Company, Ltd., Hsinchu (TW)

(72) Inventors: Chen-Hua Yu, Hsinchu (TW);
Chuei-Tang Wang, Taichung (TW);
Hsing-Kuo Hsia, Jhubei (TW);
Yu-Kuang Liao, Hsinchu (TW);
Chih-Chieh Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/885,450

(22) Filed: Jan. 31, 2018

(65) Prior Publication Data

US 2019/0162901 A1    May 30, 2019

Related U.S. Application Data

(60) Provisional application No. 62/592,516, filed on Nov. 30, 2017.

(51) Int. Cl.
  *G02B 6/124*   (2006.01)
  *G02B 6/136*   (2006.01)
  (Continued)

(52) U.S. Cl.
  CPC ............. *G02B 6/124* (2013.01); *G02B 6/136* (2013.01); *H05K 1/0274* (2013.01); *H05K 1/112* (2013.01); *H05K 1/181* (2013.01)

(58) Field of Classification Search
  None
  See application file for complete search history.

(56) References Cited

U.S. PATENT DOCUMENTS 8,802,504 B1    8/2014  Hou et al.
8,803,292 B2    8/2014  Chen et al.
(Continued)

FOREIGN PATENT DOCUMENTS

JP    2015505067 A    2/2015
KR    20040036614 A    4/2004
(Continued)

OTHER PUBLICATIONS

Wang, et al., "Direct Bond Interconnect (DBI®) for fine-pitch bonding in 3D and 2.5D integrated circuits," 2017 Pan Pacific Microelectronics Symposium (Pan Pacific), Kauai, HI, IEEE Xplore, Feb. 23, 2017, 9 pages.

*Primary Examiner* — Jerry Rahll
(74) *Attorney, Agent, or Firm* — Slater Matsil, LLP

(57) ABSTRACT

In an embodiment, a method includes: forming an interconnect including waveguides and conductive features disposed in a plurality of dielectric layers, the conductive features including conductive lines and vias, the waveguides formed of a first material having a first refractive index, the dielectric layers formed of a second material having a second refractive index less than the first refractive index; bonding a plurality of dies to a first side of the interconnect, the dies electrically connected by the conductive features, the dies optically connected by the waveguides; and forming a plurality of conductive connectors on a second side of the interconnect, the conductive connectors electrically connected to the dies by the conductive features.

20 Claims, 26 Drawing Sheets

(51) Int. Cl.
*H05K 1/11* (2006.01)
*H05K 1/02* (2006.01)
*H05K 1/18* (2006.01)

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,496,189 B2 | 3/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 2004/0150081 A1 | 8/2004 | Ogawa |
| 2009/0154868 A1 | 6/2009 | Park et al. |
| 2013/0156364 A1 | 6/2013 | Chen et al. |
| 2014/0264400 A1 | 9/2014 | Lipson et al. |
| 2014/0363121 A1* | 12/2014 | Lai .................... G02B 6/12002 385/14 |
| 2014/0376857 A1 | 12/2014 | Chantre et al. |
| 2017/0033080 A1 | 2/2017 | Chen et al. |
| 2017/0194309 A1 | 7/2017 | Evans et al. |
| 2017/0299809 A1 | 10/2017 | Boeuf et al. |

FOREIGN PATENT DOCUMENTS

| | | |
|---|---|---|
| KR | 20090064951 A | 6/2009 |
| KR | 20170015073 A | 2/2017 |

* cited by examiner

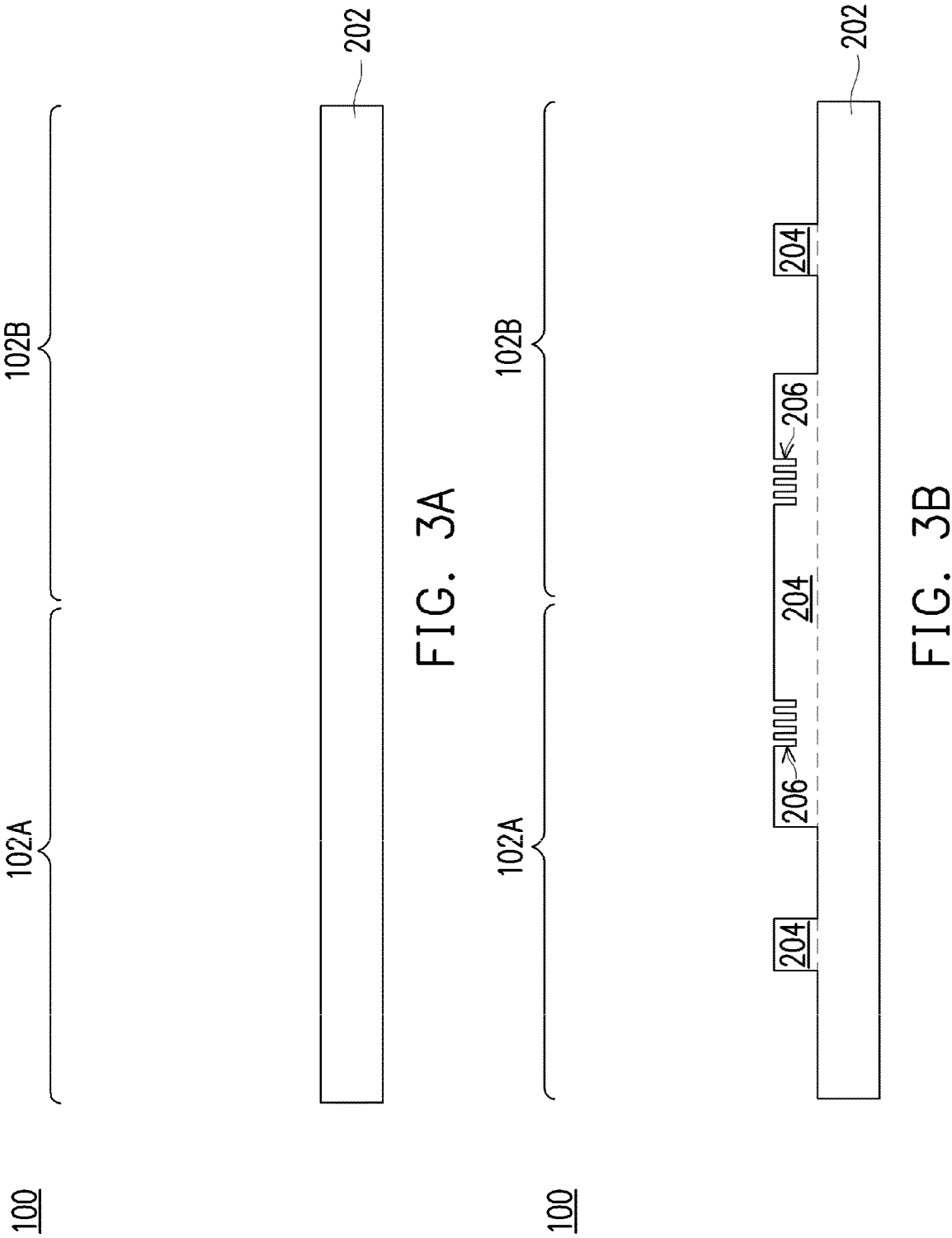

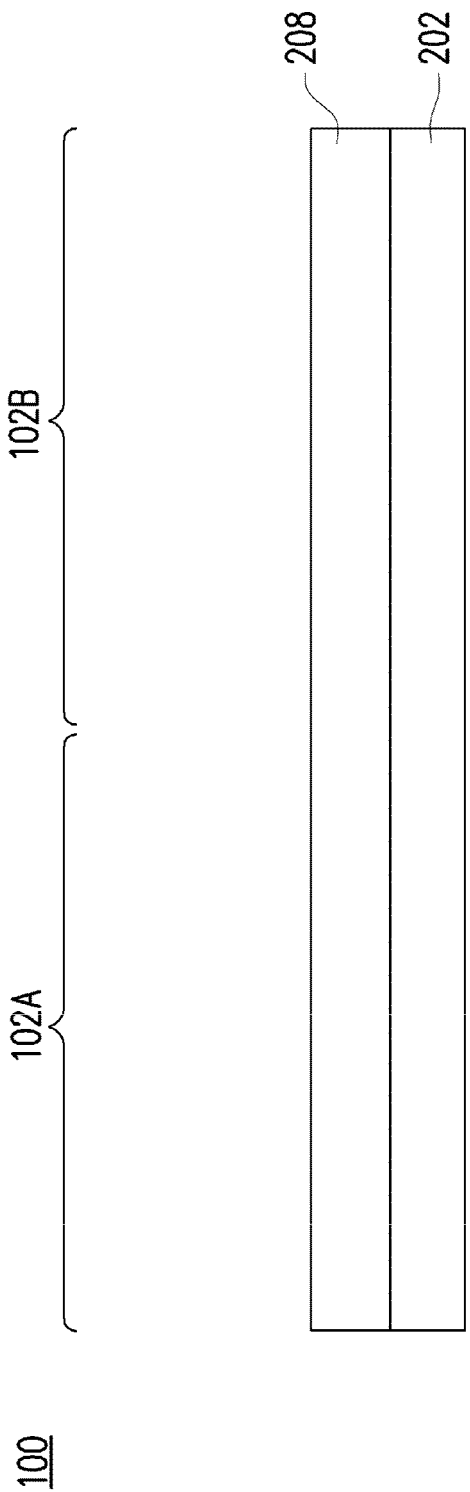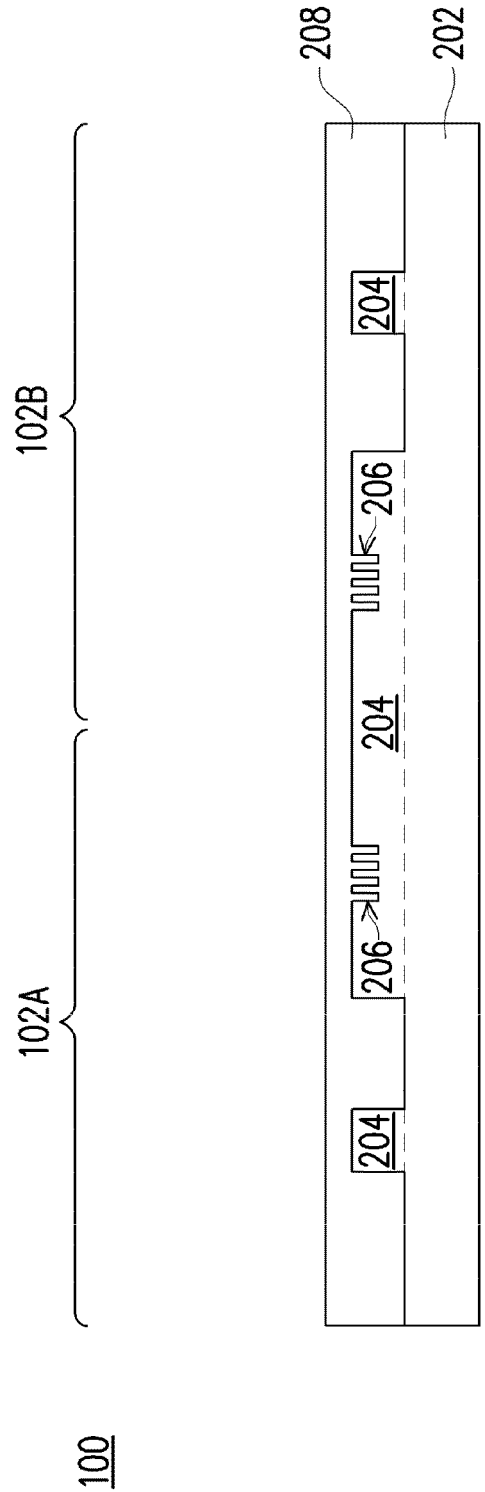

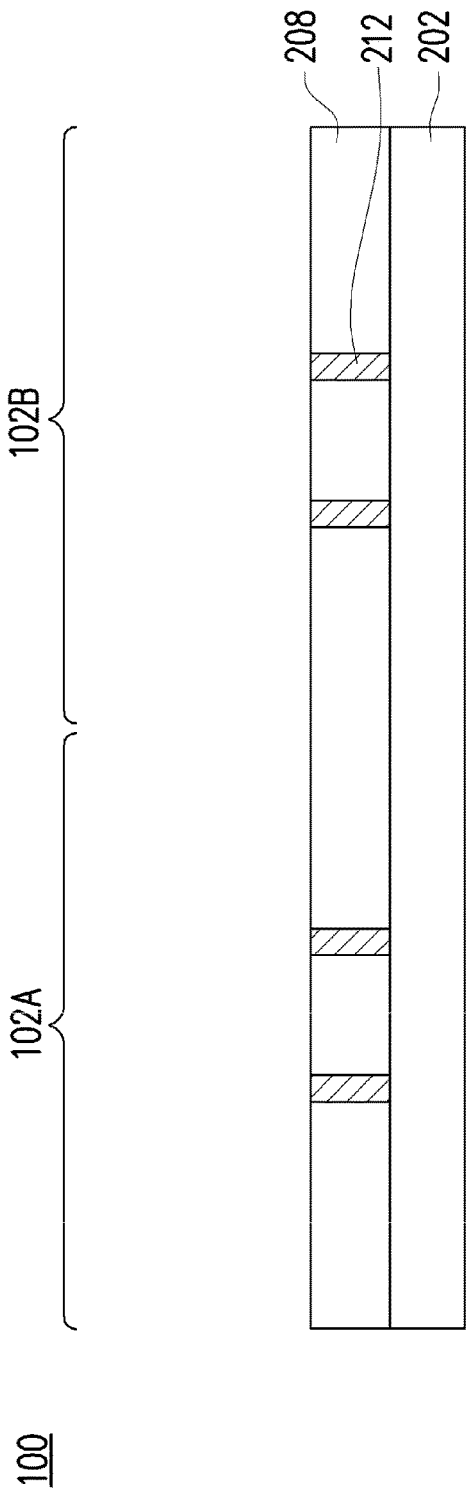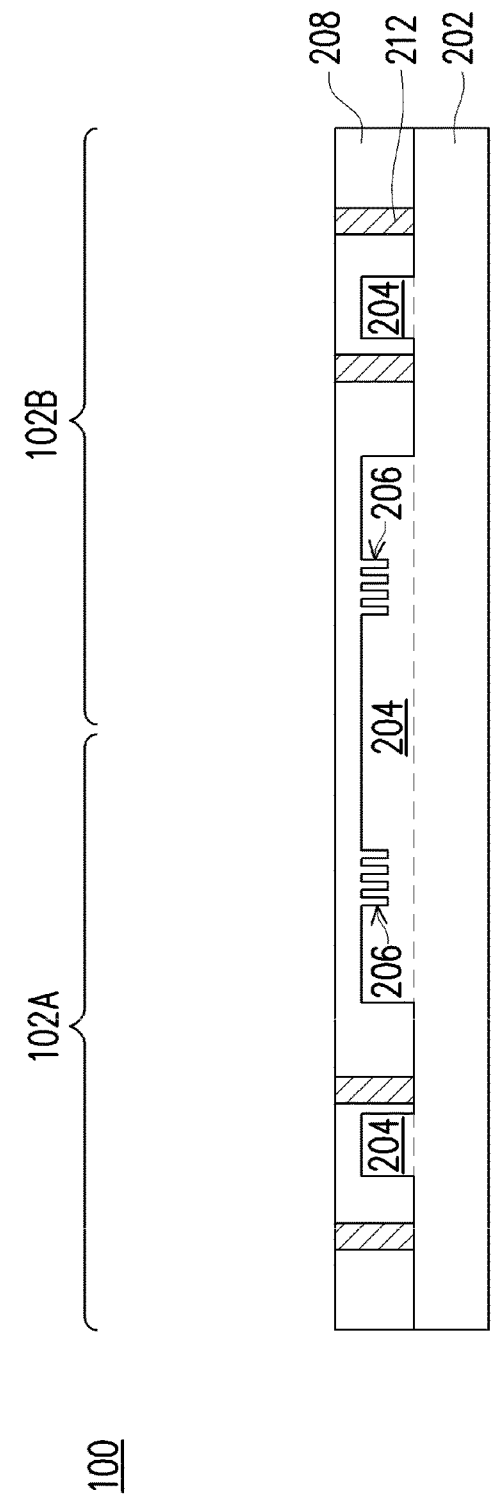

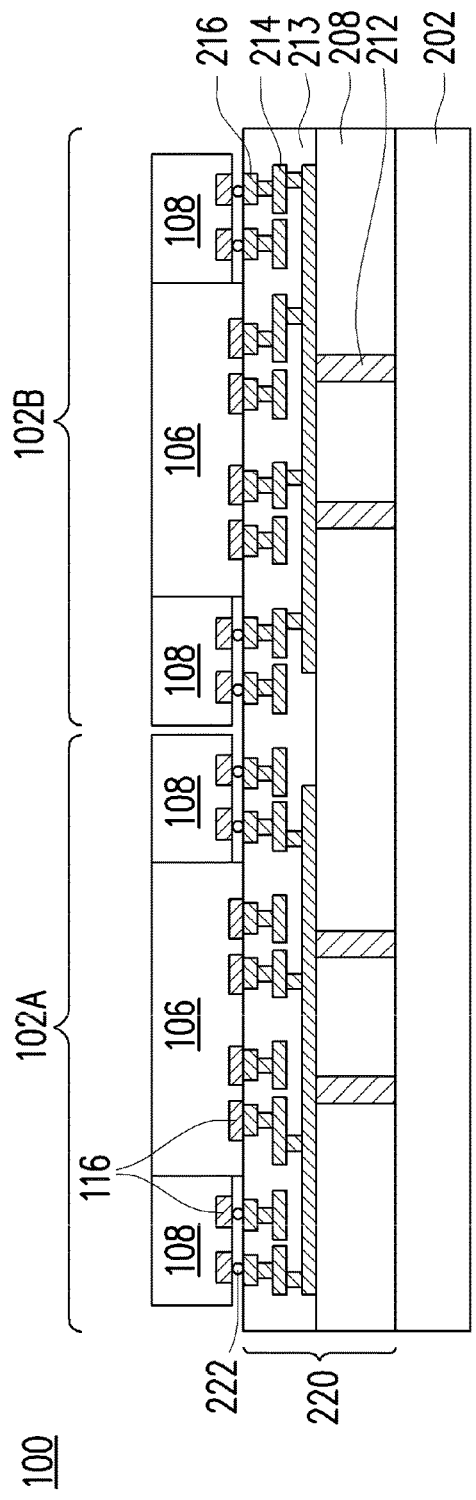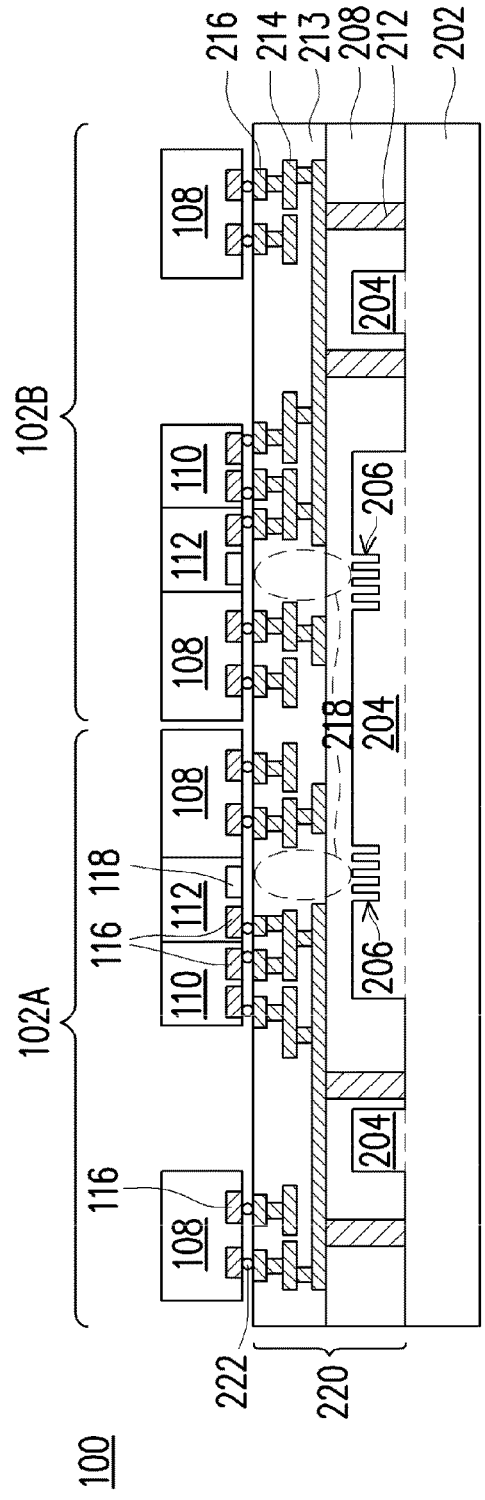

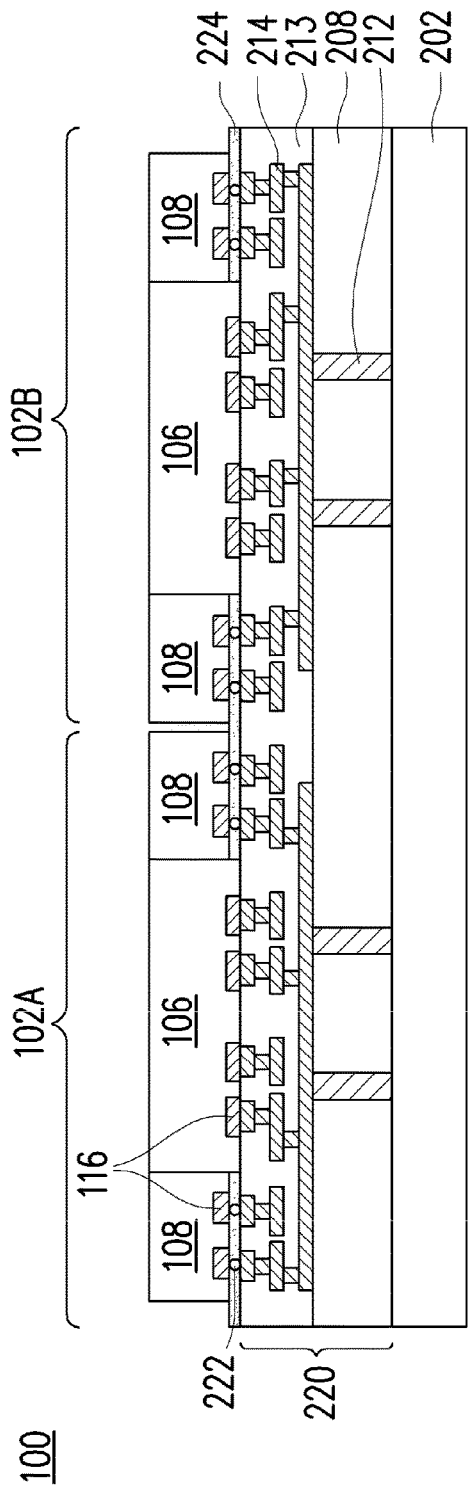
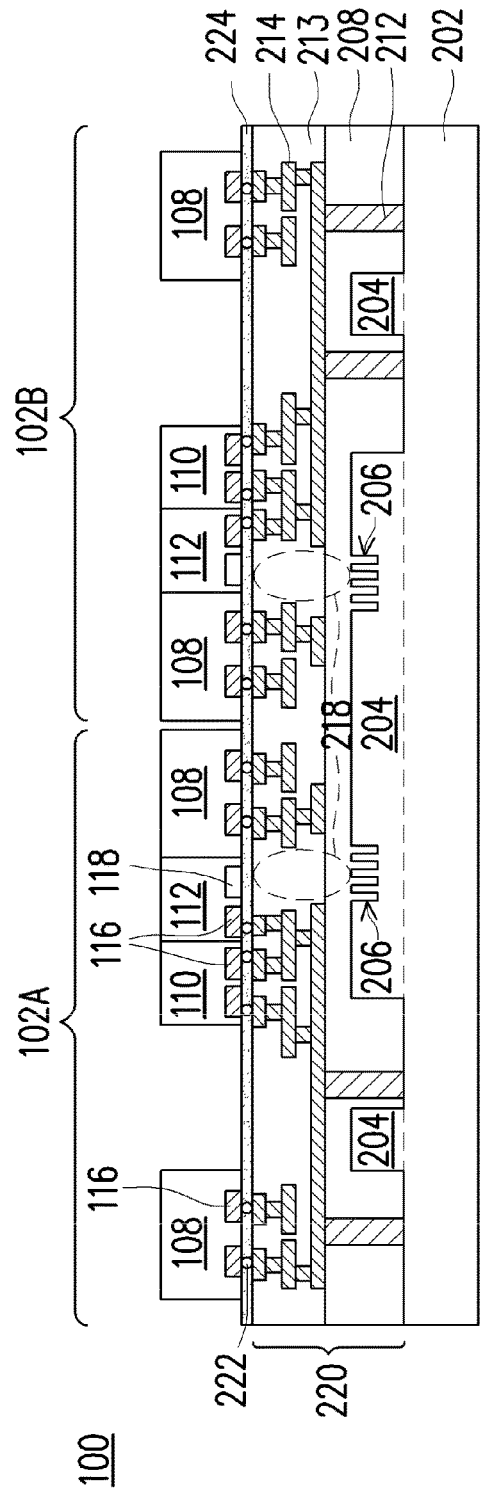
FIG. 9A
FIG. 9B

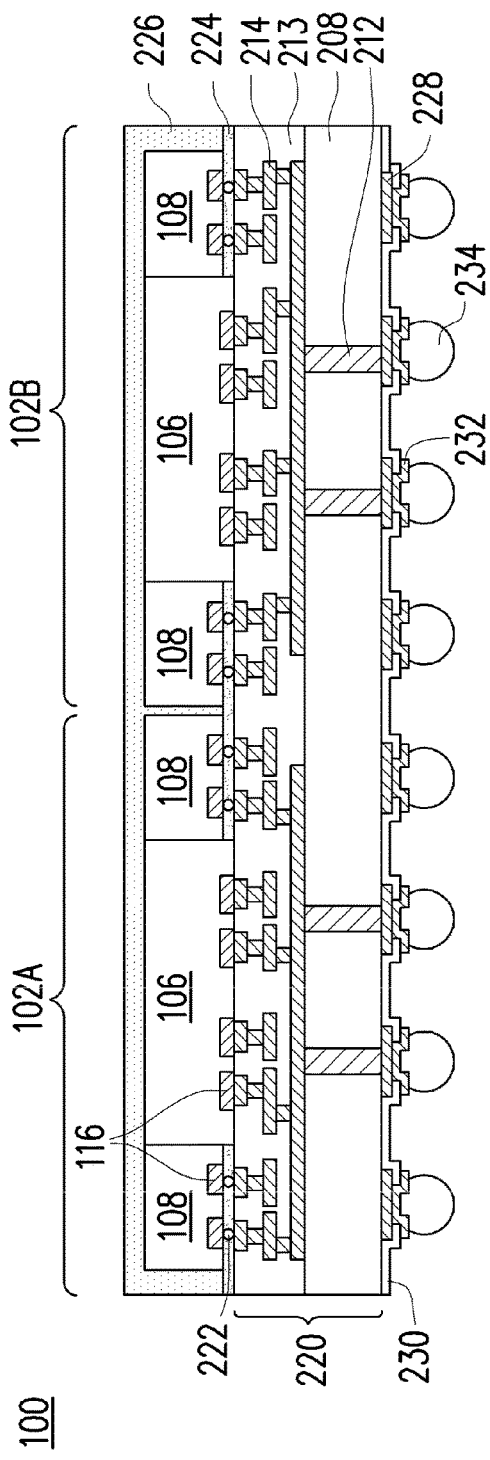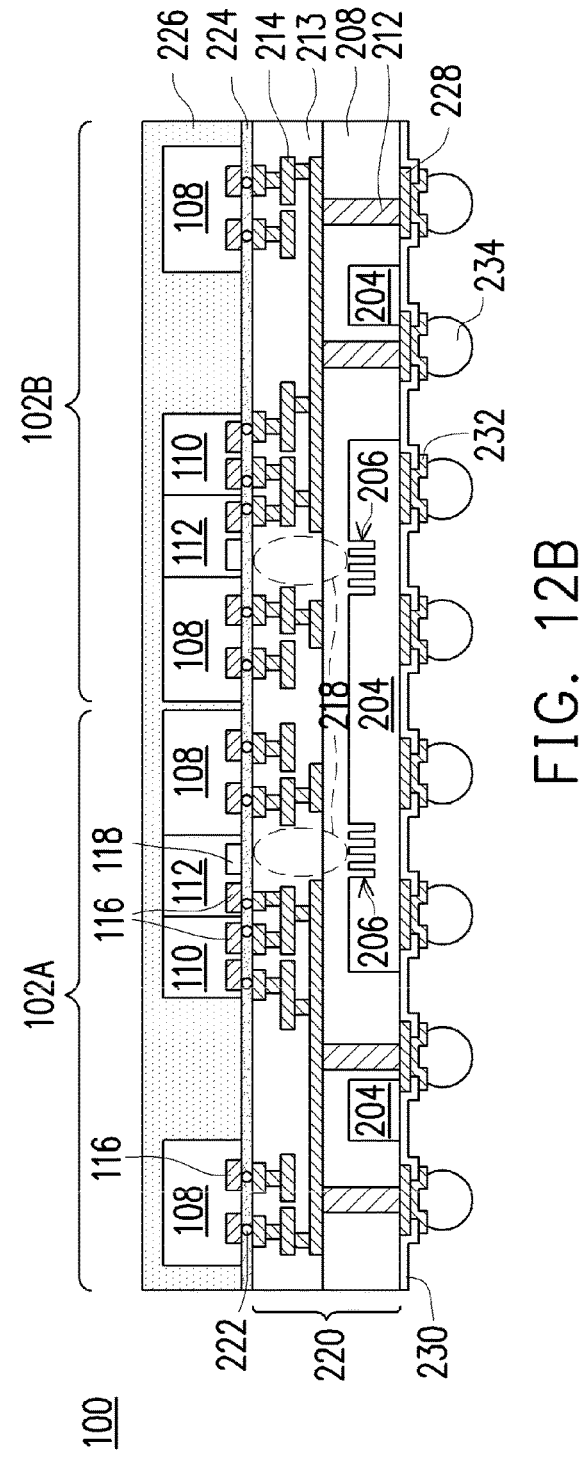
FIG. 12A
FIG. 12B

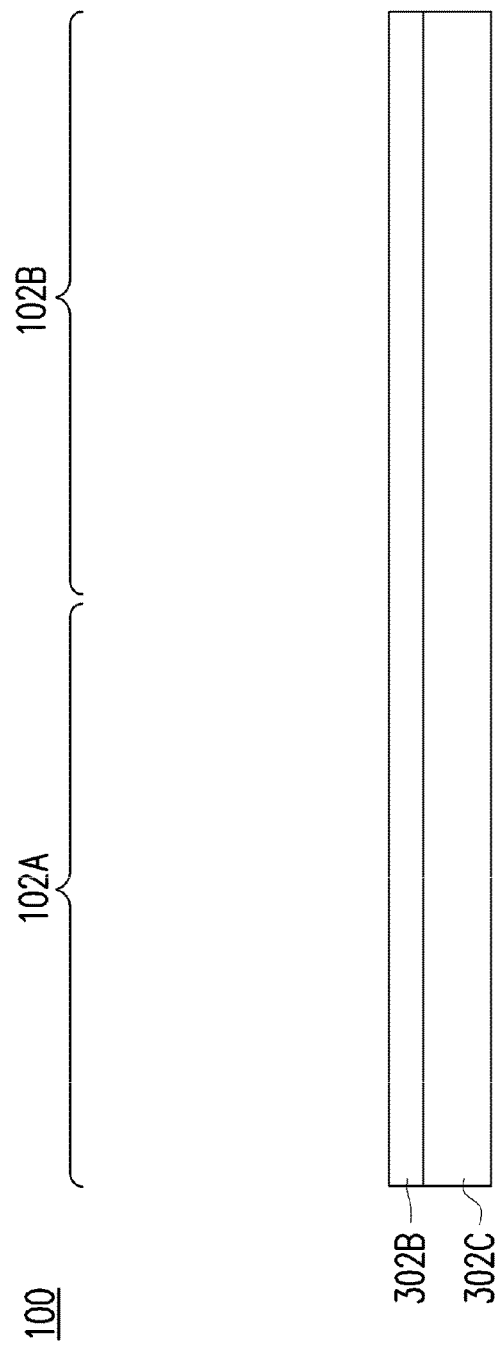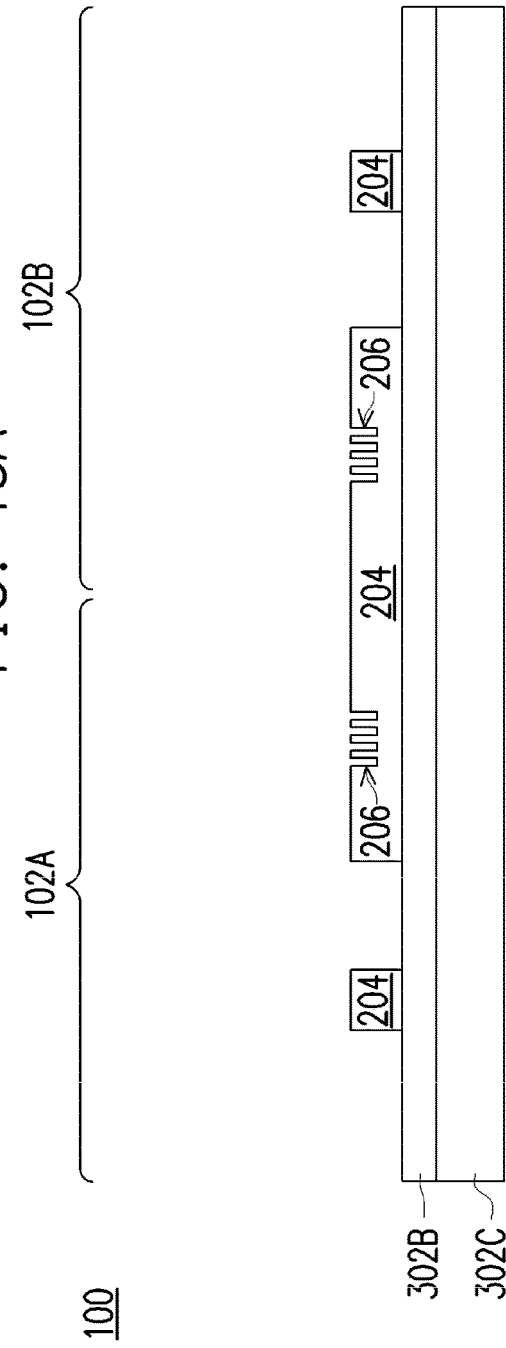

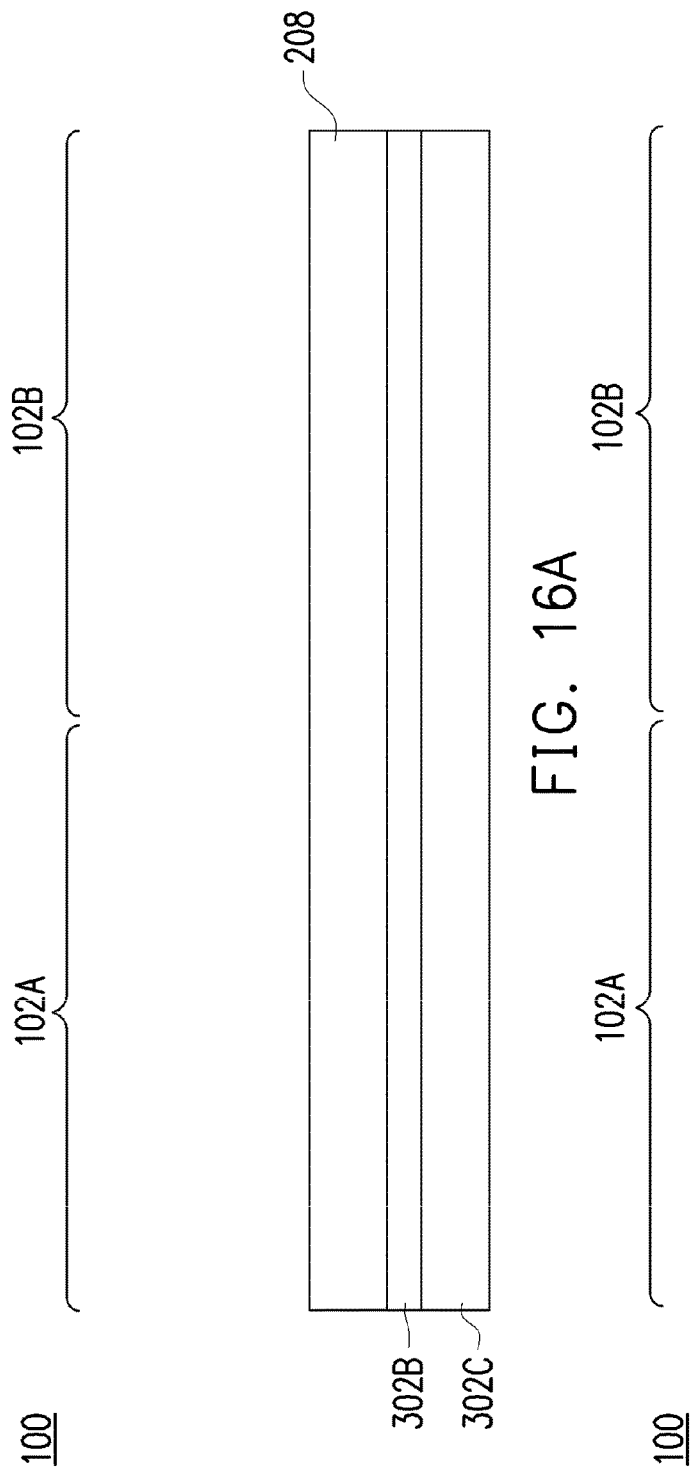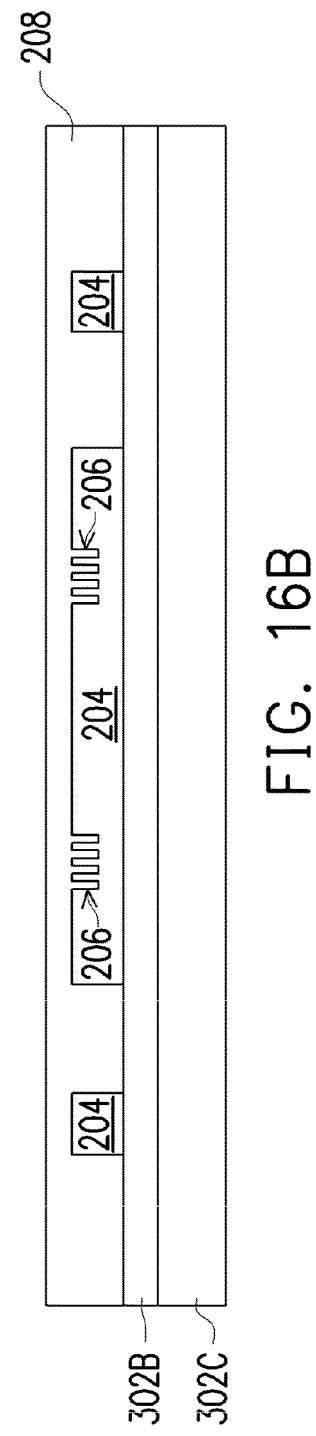

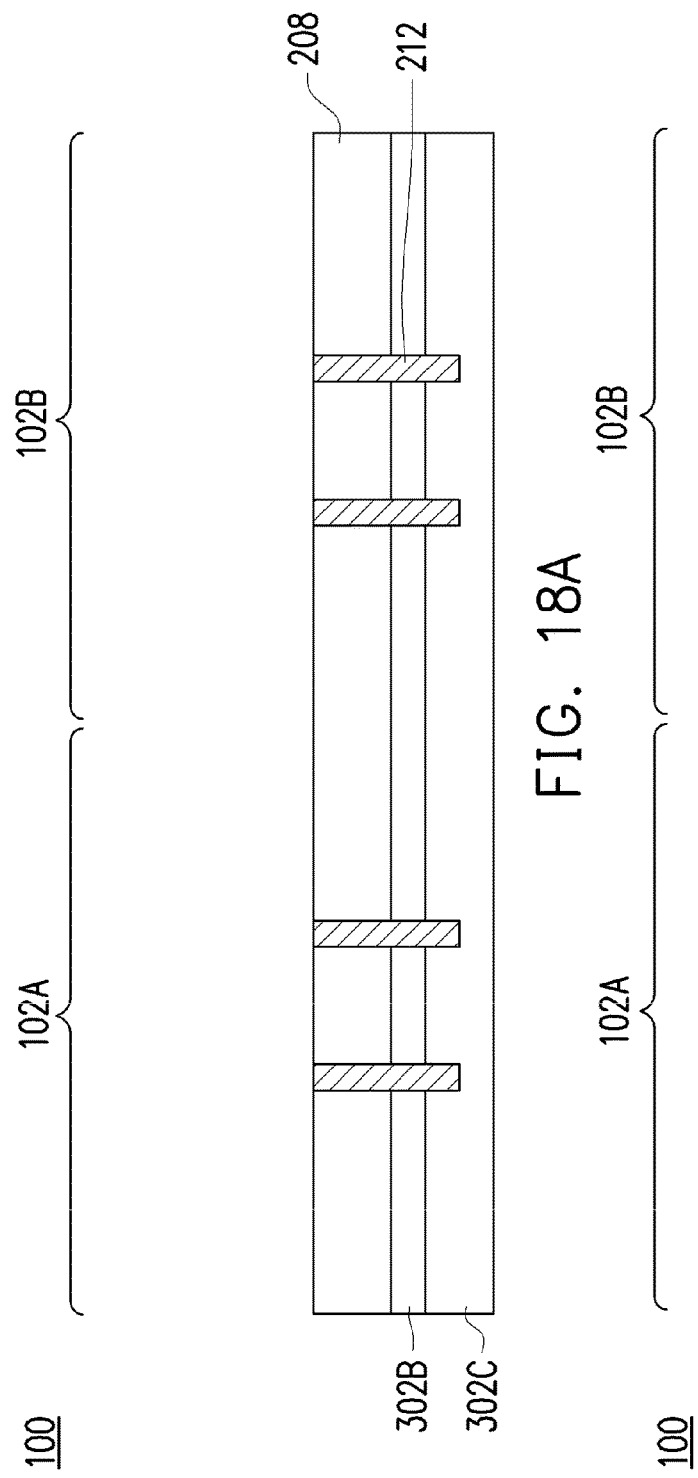
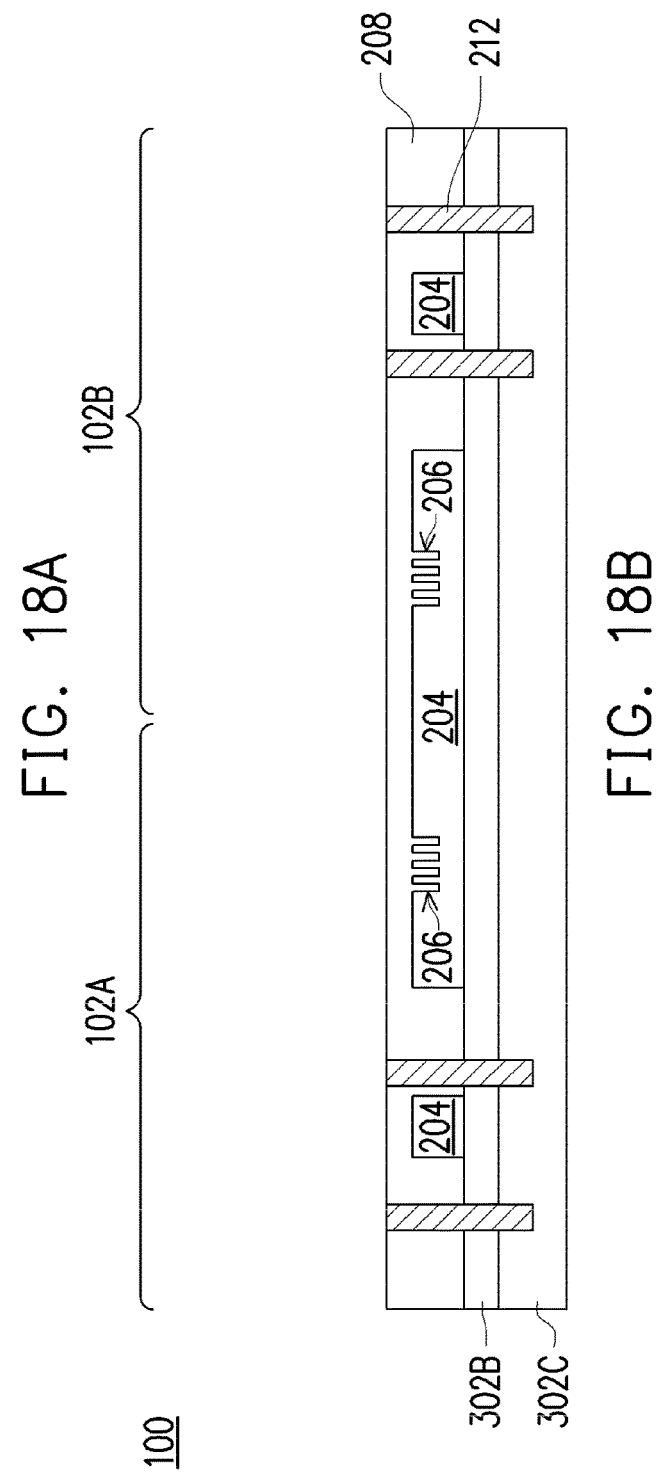

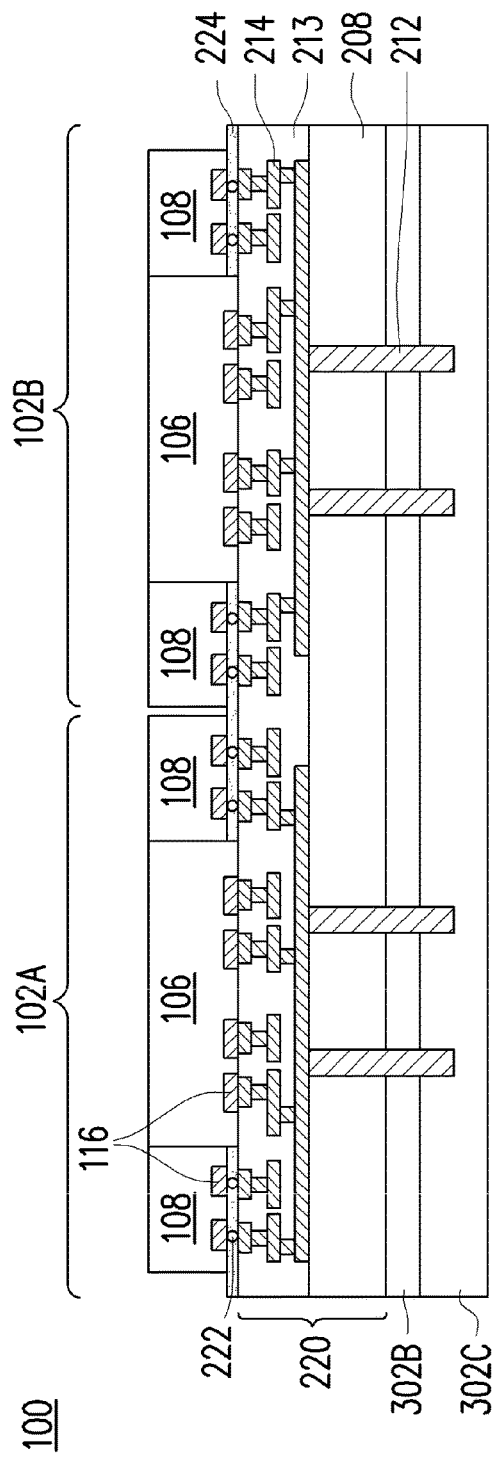
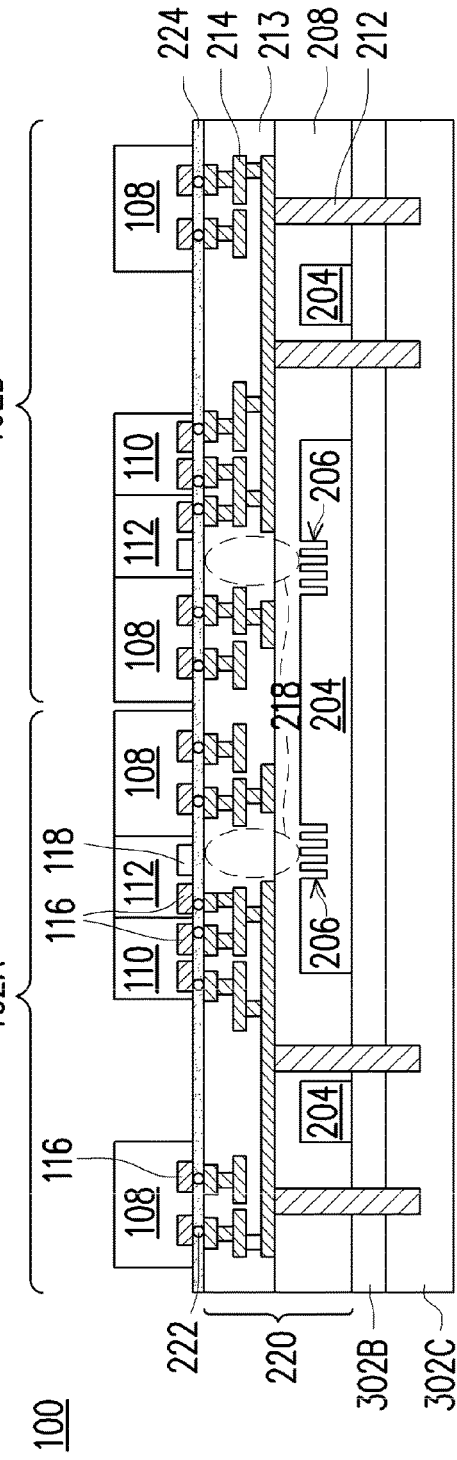
FIG. 21A
FIG. 21B

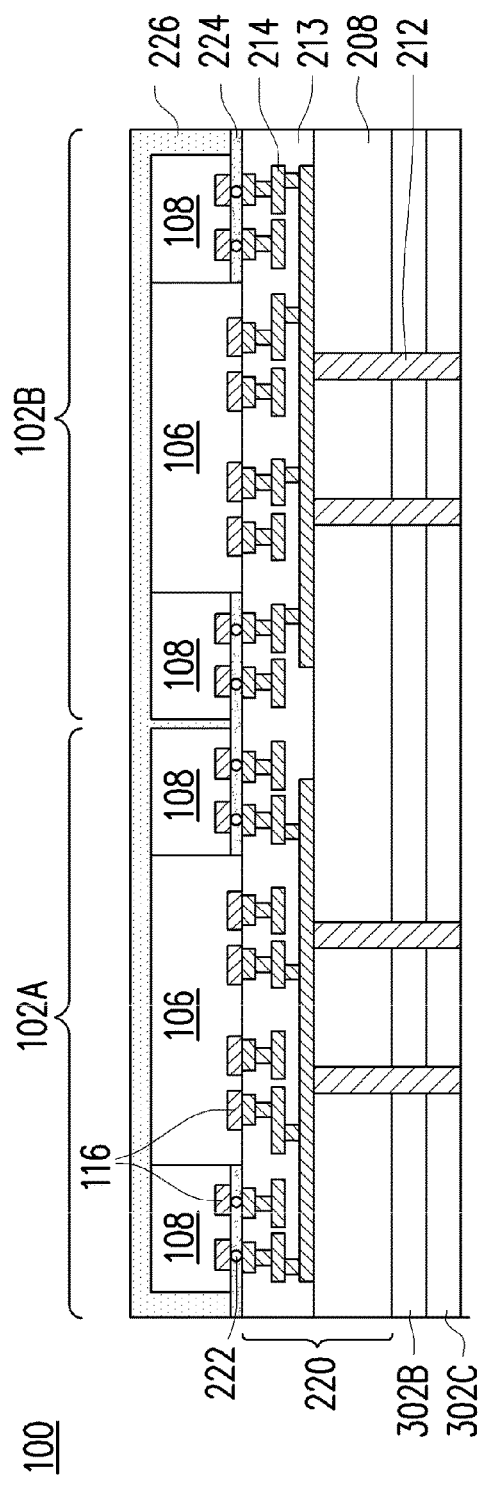
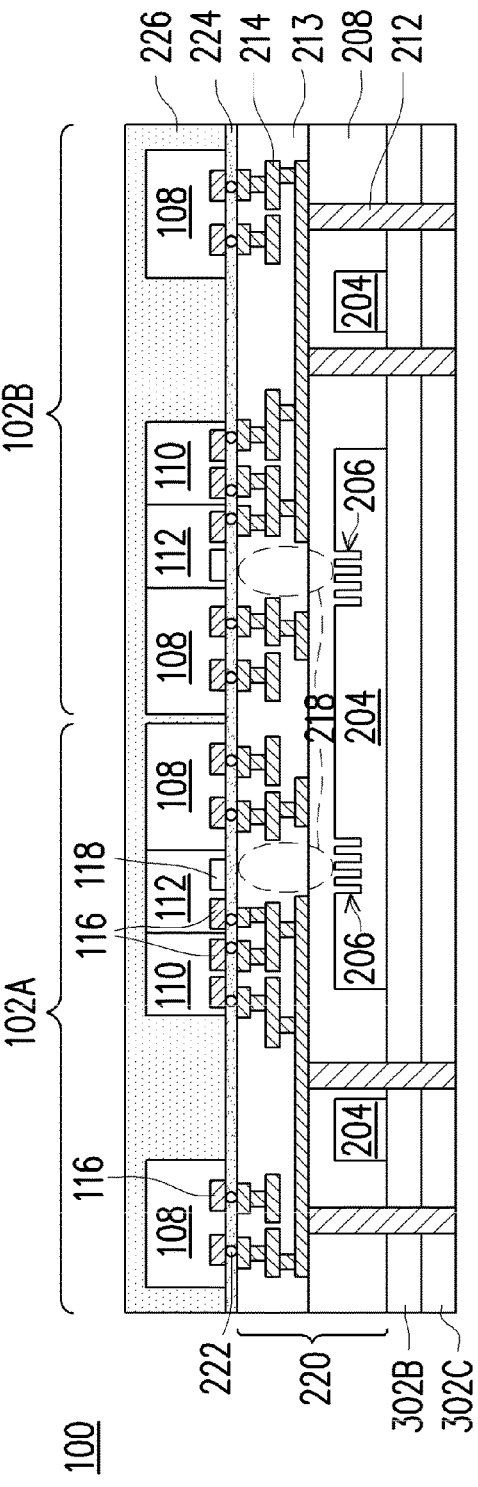
FIG. 23A
FIG. 23B

HYBRID INTERCONNECT DEVICE AND METHOD

PRIORITY CLAIM AND CROSS-REFERENCE

This application claims the benefits of U.S. Provisional Application Ser. No. 62/592,516, filed on Nov. 30, 2017, which application is hereby incorporated herein by reference in its entirety.

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating optical components and electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 12B are various views of intermediate steps during a process for forming the multi-chip system, in accordance with some embodiments.

FIGS. 14A through 24B are various views of intermediate steps during a process for forming the multi-chip system, in accordance with some other embodiments.

DETAILED DESCRIPTION

Figure 1A:
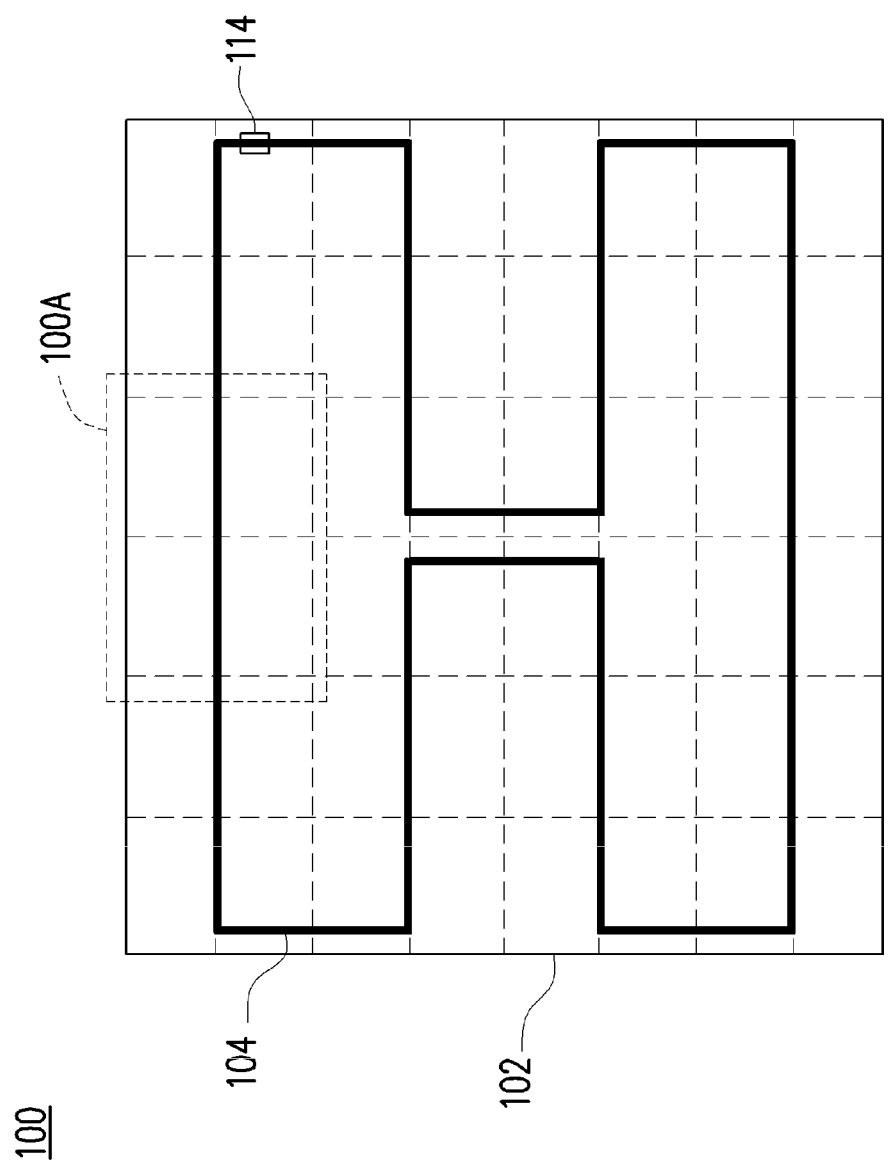
FIGS. 1A and 1B illustrate a multi-chip system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three-dimensional (3D) packages including both optical devices and electrical devices, and the method of forming the same are provided, in accordance with some embodiments. In particular, a hybrid interconnect is formed having conductive features for transmitting electrical signals and waveguides for transmitting optical signals. Dies for forming different computing sites are attached to the hybrid interconnect. The different sites are optically and electrically connected by the hybrid interconnect. The intermediate stages of forming the packages are illustrated, in accordance with some embodiments. Some variations of some embodiments are discussed. Throughout the various views and illustrative embodiments, like reference numbers are used to designate like elements.

Figure 1B:
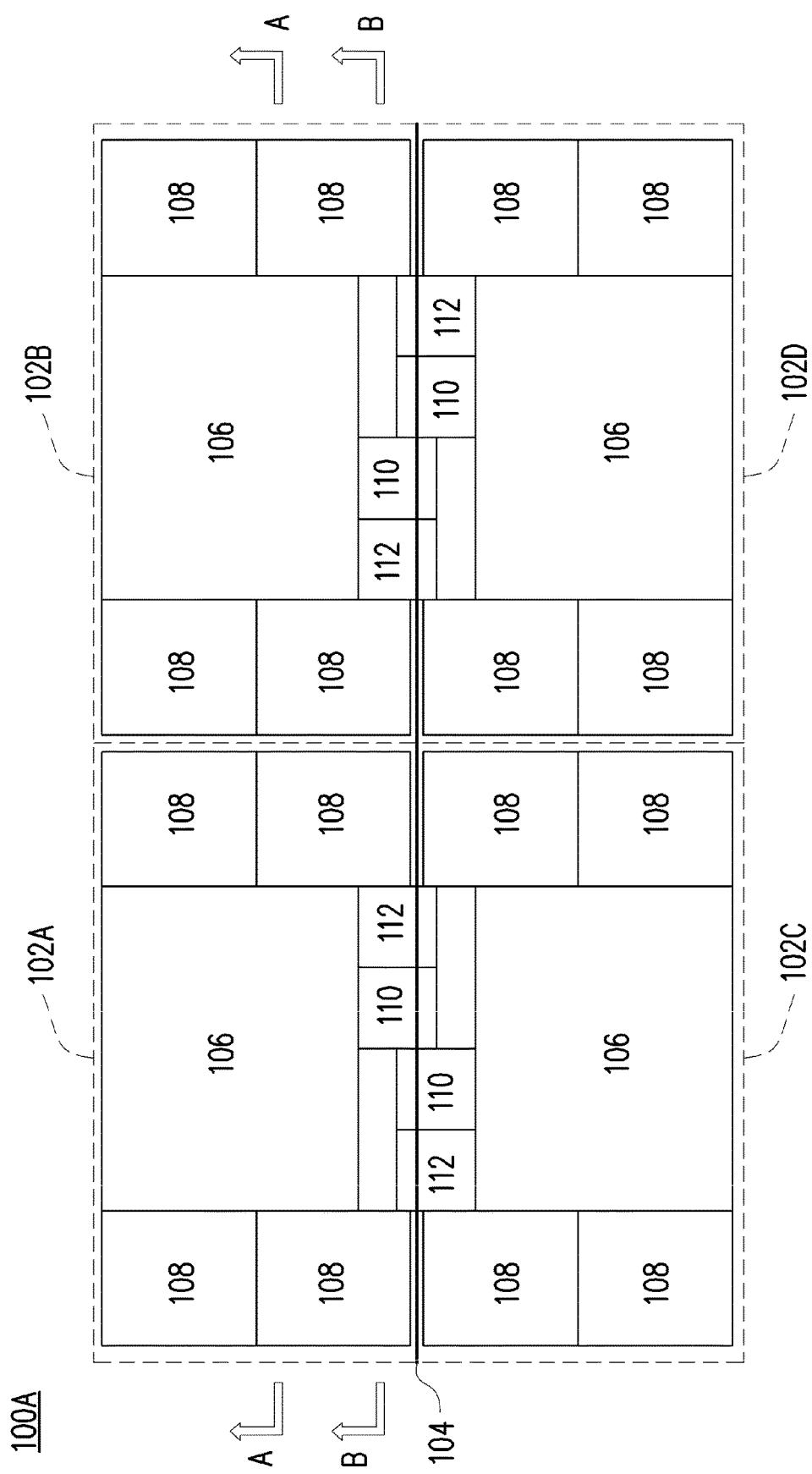

FIGS. 1A and 1B illustrate a multi-chip system 100, in accordance with some embodiments. The multi-chip system 100 is, e.g., a high performance computing (HPC) system, and includes a plurality of sites 102, each of which is a separate computing system. FIG. 1A shows all of the sites 102, and FIG. 1B is a detailed view of a region 100A that shows four sites 102A through 102D.

The sites 102 are interconnected by an optical pathway 104, which allows the separate computing systems to communicate. In particular, the optical pathway 104 is a closed loop (or ring) that connects to each site 102 of the multi-chip system 100. As such, each site 102 may communicate with any of the other sites 102 via the optical pathway 104. In an embodiment, the optical pathway 104 includes a plurality of waveguides, and each waveguide connects two of the sites 102 in a peer-to-peer manner. In some embodiments the optical pathway 104 is a silicon photonic interconnect, although other types of optical pathways could be used. Each site 102 includes a processor die 106, memory dies 108, an electronic die 110, and a photonic die 112. The optical pathway 104 extends under one or more components of each site 102, but at least extends under the photonic die 112 of each site 102. The sites 102 are interconnected by an electrical pathway (not shown in FIGS. 1A and 1B, but described below).

The processor die 106 may be a central processing unit (CPU), graphics processing unit (GPU), application-specific integrated circuit (ASIC), or the like. The memory dies 108 may be volatile memory such as dynamic random-access memory (DRAM), static random-access memory (SRAM), or the like. In the embodiment shown, each site includes one processor die 106 and four memory dies 108, although it should be appreciated that each site 102 may include more or less memory dies 108.

The photonic die 112 transmits and receives optical signals. In particular, the photonic die 112 converts electrical signals from the processor die 106 to optical signals, and convert optical signals from the optical pathway 104 to electrical signals. Accordingly, the photonic die 112 is responsible for the input/output (I/O) of optical signals to/from the optical pathway 104. The photonic die 112 may be a photonic integrated circuit (PIC). The photonic die 112 is optically coupled to the optical pathway 104 and electrically coupled to the electronic die 110 by an optical I/O port 118 (illustrated below in FIGS. 8A and 8B). The electronic die 110 includes the electronic circuits needed to interface the processor die 106 with the photonic die 112. For example, the electronic die 110 may include controllers, transimpedance amplifiers, and the like. The electronic die 110 controls high-frequency signalling of the photonic die 112 according to electrical signals (digital or analog) received from the processor die 106. The electronic die 110 may be an electronic integrated circuit (EIC).

A laser source 114 provides a carrier signal to each site 102 via the optical pathway 104. The laser source 114 may be part of one of the sites 102, or may be located outside of the sites 102, and is optically coupled to the optical pathway 104 by edge or grating coupling. The laser source 114 may transmit the carrier signal along one of the waveguides of the optical pathway 104 such that it is received by the photonic die 112 of each site 102. The photonic dies 112 produce the optical signals by modulating the carrier signal according to the electrical signals from the processor die 106.

Although the processor die 106, memory dies 108, and electronic die 110 are illustrated as being separate dies, it should be appreciated that the sites 102 could be system-on-chip (SoC) or system-on-integrated-circuit (SoIC) devices. In such embodiments, the processing, memory, and/or electronic control functionality may be integrated on the same die.

FIGS. 2A through 12B are various views of intermediate steps during a process for forming the multi-chip system 100, in accordance with some embodiments. FIGS. 2A through 12B are cross-sectional views, where figures ending with an "A" designation are illustrated along cross-section A-A of FIG. 1B (e.g., along the processor dies 106 and memory dies 108), and figures ending with a "B" designation are illustrated along cross-section B-B of FIG. 1B (e.g., along the memory dies 108, photonic dies 112, and electronic dies 110).

Figure 2A:
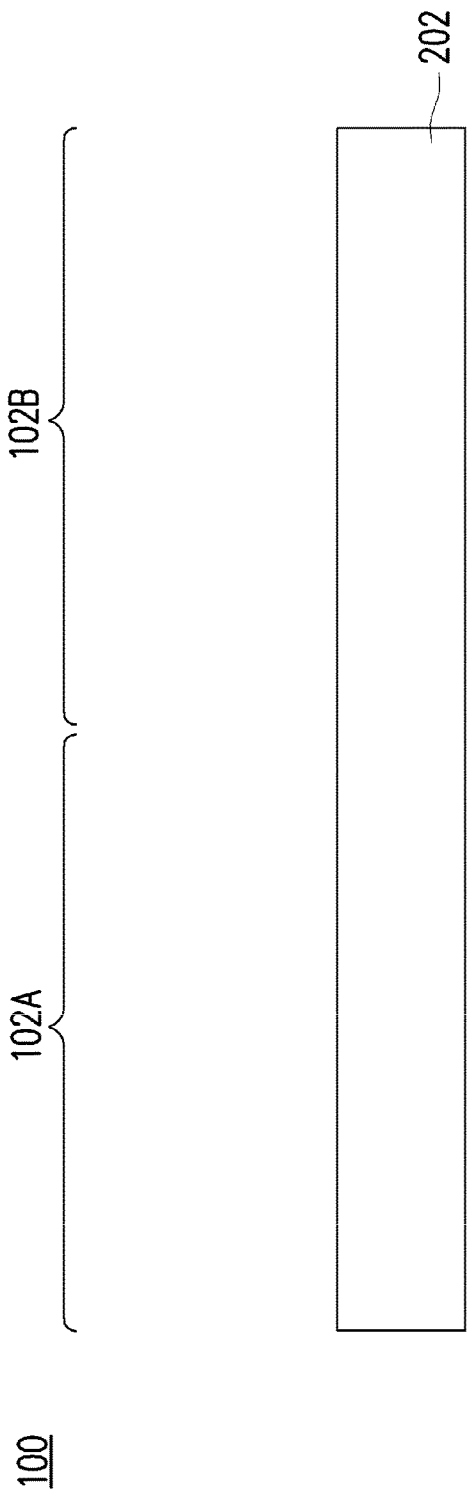
Figure 2B:
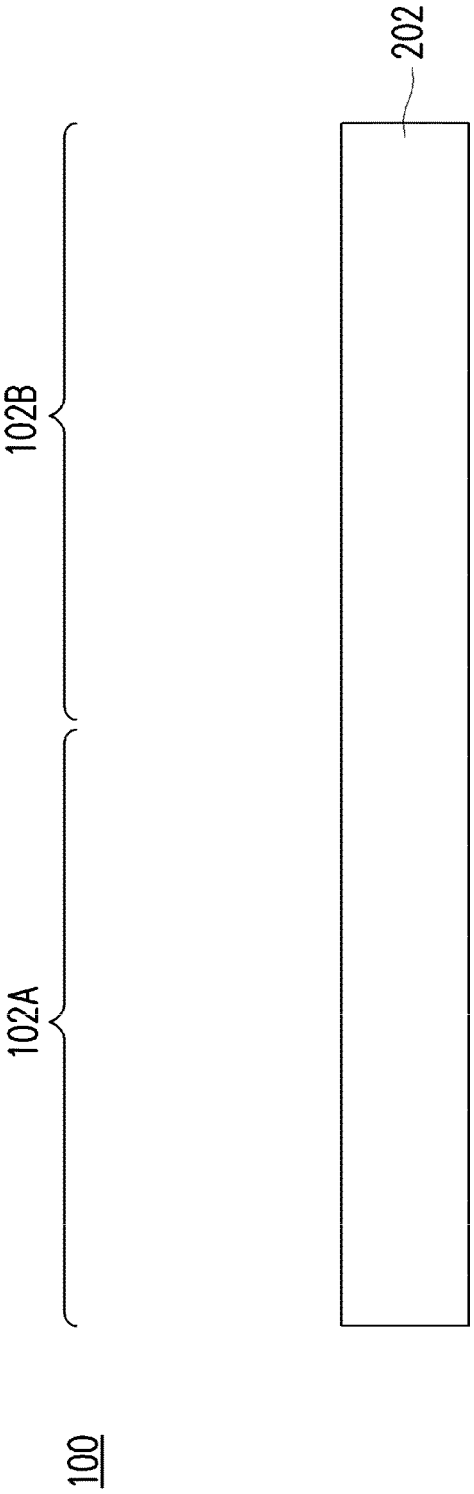

In FIGS. 2A and 2B, a substrate 202 is provided. The substrate 202 may be a semiconductor substrate, such as a bulk semiconductor or the like, which may be doped (e.g., with a p-type or an n-type dopant) or undoped. The substrate 202 may be a wafer, such as a silicon wafer. Other substrates, such as a multi-layered or gradient substrate may also be used. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the substrate 202 is a silicon wafer, e.g., a 12 inch silicon wafer. The substrate may be referred to as having a front side or surface (e.g., the side facing upwards in FIGS. 2A and 2B), and a back side or surface (e.g., the side facing downwards in FIGS. 2A and 2B). The substrate 202 has several regions, including a first region where the site 102A will be formed, and the second region where the site 102B will be formed.

In FIGS. 3A and 3B, the front side of the substrate 202 is patterned to form waveguides 204. The waveguides 204 form a continuous ring connecting all the sites 102 of the multi-chip system 100. Patterning the substrate 202 may be accomplished with acceptable photolithography and etching techniques. For example, a photoresist may be formed and developed on the front side of the substrate 202. The photoresist may be patterned with openings corresponding to the waveguides 204. One or more etching processes may be performed using the patterned photoresist as an etching mask. In particular, the front side of the substrate 202 may be etched to form recesses defining the waveguides 204; the remaining unrecessed portions of the substrate 202 form the waveguides 204, with sidewalls of the remaining unrecessed portions defining sidewalls of the waveguides 204. The etching processes may be an anisotropic wet or dry etch. It should be appreciated that the dimensions of the waveguides 204 depends on the application; in an embodiment, the waveguides 204 have a width of from about 500 nm to about 3000 nm, such as about 500 nm, and a height of from about 220 nm to about 300 nm, such as about 250 nm.

The waveguides 204 comprise grating couplers 206, which are formed in top portions of the waveguides 204. The grating couplers 206 allow the waveguides 204 to transmit light to or receive light from the overlying light source or optical signal source (e.g., the photonic dies 112). The grating couplers 206 may be formed by acceptable photolithography and etching techniques. In an embodiment, the grating couplers 206 are formed after the waveguides 204 are defined. For example, a photoresist may be formed and developed on the front side of the substrate 202 (e.g., on the waveguides 204 and in the recesses defining them). The photoresist may be patterned with openings corresponding to the grating couplers 206. One or more etching processes may be performed using the patterned photoresist as an etching mask. In particular, the front side of the substrate 202 may be etched to form recesses in the waveguides 204 defining the grating couplers 206. The etching processes may be an anisotropic wet or dry etch.

In FIGS. 4A and 4B, a dielectric layer 208 is formed on the front side of the substrate 202. The dielectric layer 208 is formed over the waveguides 204, and in the recesses defining the waveguides 204 and grating couplers 206. The dielectric layer 208 may be formed of silicon oxide, silicon nitride, a combination thereof, or the like, and may be formed by CVD, PVD, atomic layer deposition (ALD), a spin-on-dielectric process, the like, or a combination thereof. After formation, the dielectric layer 208 may be planarized, such as by a chemical mechanical polish (CMP) or a mechanical grinding, to avoid transfer of the pattern of the waveguides 204 to the dielectric layer 208. In an embodiment, the dielectric layer 208 is an oxide of the material of the substrate 202, such as silicon oxide. Due to the difference in refractive indices of the materials of the waveguides 204 and dielectric layer 208, the waveguides 204 have high internal reflections such that light is confined in the waveguides 204, depending on the wavelength of the light and the reflective indices of the respective materials. In an embodiment, the refractive index of the material of the waveguides 204 is higher than the refractive index of the material of the dielectric layer 208.

Figure 5A:
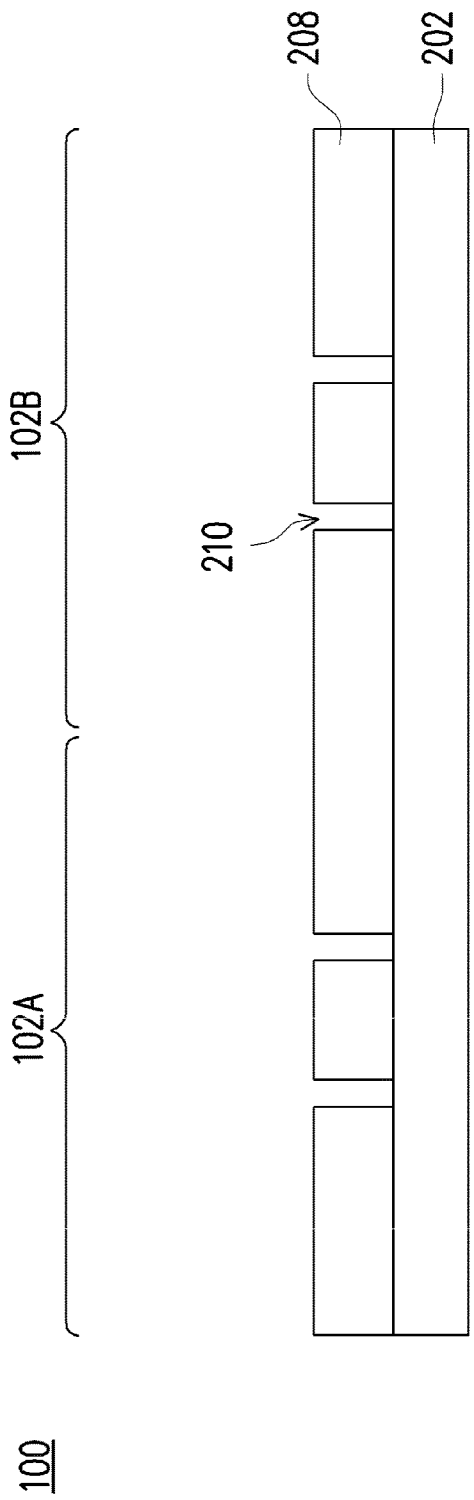
Figure 5B:
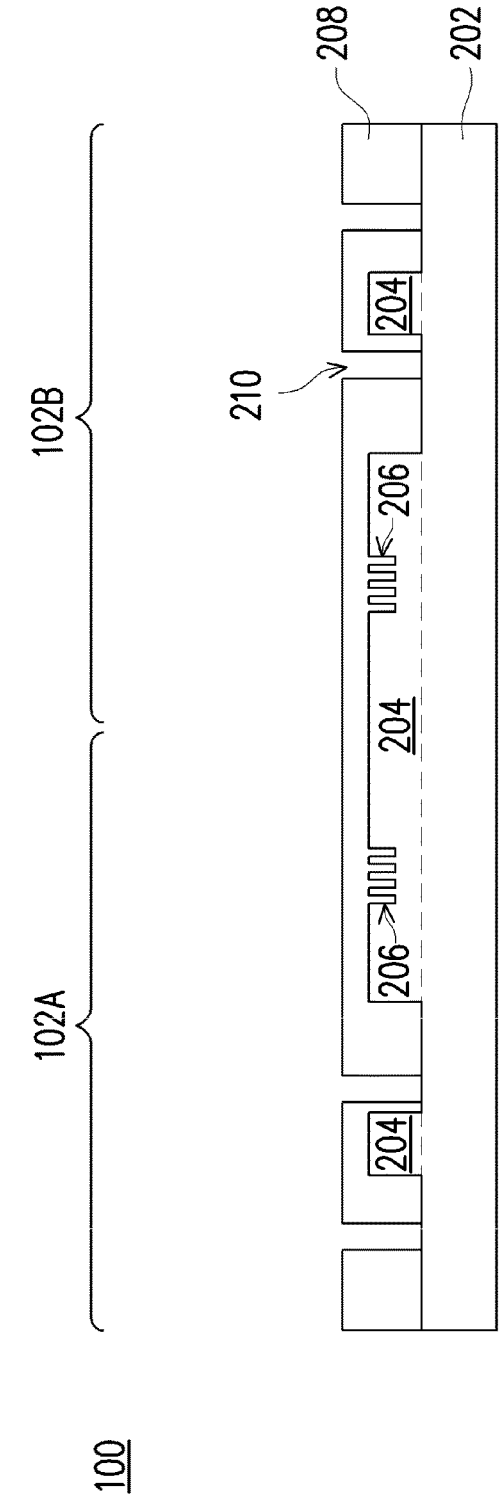

In FIGS. 5A and 5B, openings 210 are formed in the dielectric layer 208. The openings 210 may be formed by acceptable photolithography and etching techniques. One or more etching steps may be performed that are selective to the material of the dielectric layer 208, such that the openings 210 do not extend substantially into the substrate 202.

In FIGS. 6A and 6B, a conductive material is formed in the openings 210, thereby forming vias 212 in the dielectric layer 208. A liner (not shown), such as a diffusion barrier layer, an adhesion layer, or the like, may be formed in the openings 210 from TaN, Ta, TiN, Ti, CoW, or the like, and may be formed in the openings by a deposition process such as ALD or the like. A seed layer (not shown), which may include copper or a copper alloy may be deposited in the openings 210. A conductive material is formed in the openings 210 using, for example, ECP or electro-less plating. The conductive material may be a metallic material including a metal or a metal alloy such as copper, silver, gold, tungsten, cobalt, aluminum, or alloys thereof. A planarization process, such as a CMP or mechanical grinding may be performed to remove excess conductive material along the top surface of the dielectric layer 208, such that top surfaces of the vias 212 and dielectric layer 208 are level.

Figure 7A:
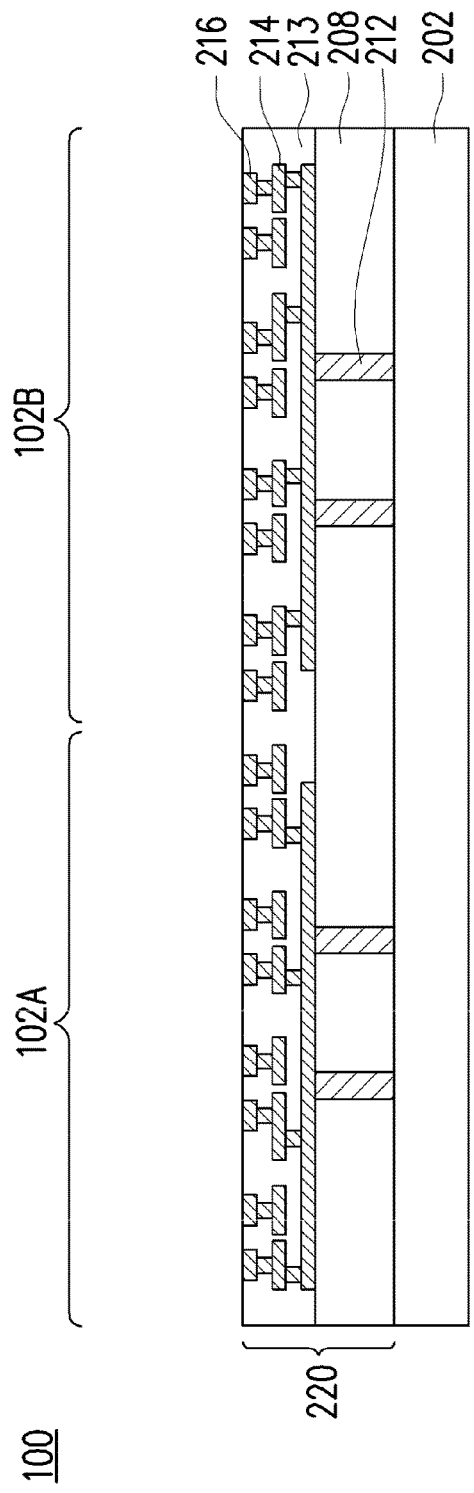
Figure 7B:
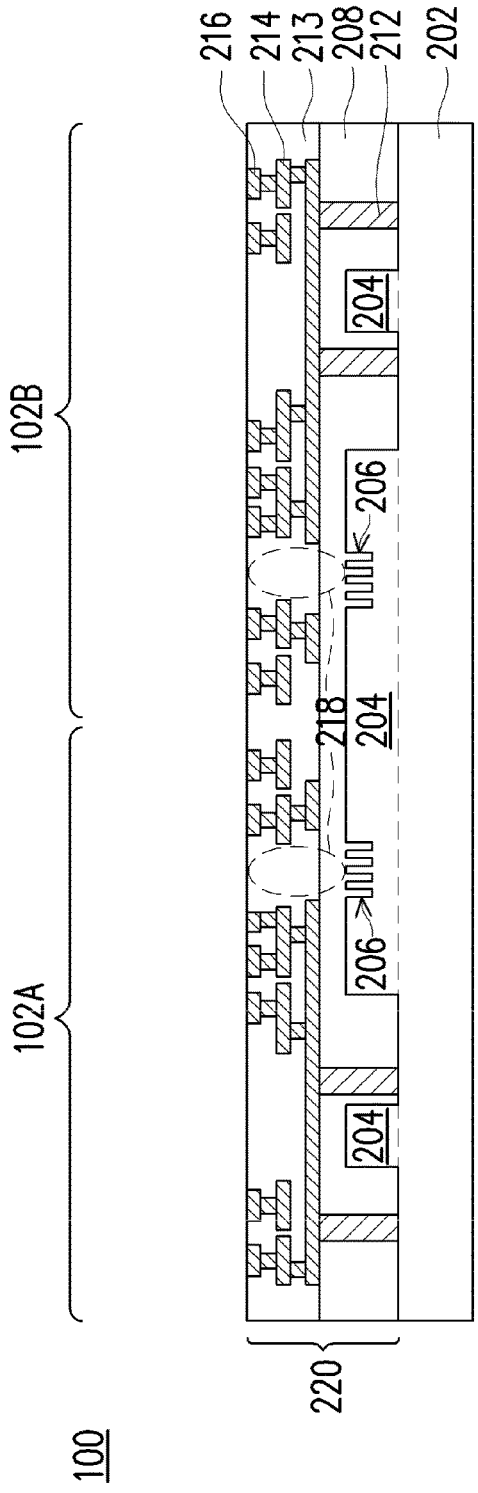

In FIGS. 7A and 7B, dielectric layers 213 are formed, and conductive features 214 are formed in the dielectric layers 213. The dielectric layers 213 may be formed from a material selected from the candidate materials of the dielectric layer 208, or may include a different material. The dielectric layers 213 may be formed by a method selected from the candidate methods of forming the dielectric layer 208, or may be formed by a different method. For example, in some embodiments, the dielectric layer 208 are formed from a low-k dielectric material. The conductive features 214 may be lines and vias, and may be formed by a damascene process, e.g., dual damascene, single damascene, or the like. Pads 216 are formed connected to the conductive features 214 in the topmost layer of the dielectric layers 213, and may include microbumps, conductive pads, underbump metallization structures, solder connectors, and/or the like.

The conductive features 214 are only formed in a subset of the regions of the dielectric layers 213. In particular, some regions of the dielectric layers 213 are substantially free of the conductive features 214. The regions are portions of the dielectric layers 213 that are along optical transmission paths 218 for the optical signals. The optical transmission paths 218 extend between the grating couplers 206 and an overlying light source or optical signal source (e.g., the photonic dies 112, attached later).

The combination of the waveguides 204, dielectric layer 208, dielectric layers 213, conductive features 214, and pads 216 form what is referred to herein as a hybrid interconnect 220. The hybrid interconnect 220 includes conductive features 214 for interconnecting dies with electrical signals, and also includes waveguides 204 for interconnecting dies with optical signals.

In FIGS. 8A and 8B, the processor dies 106, memory dies 108, photonic dies 112, and electronic dies 110 are attached to hybrid interconnect 220. The various dies each include die connectors 116 that are connected to the pads 216 of the hybrid interconnect 220. The various dies may be bonded such that the front side of the substrate 202 and the active surfaces of processor dies 106, memory dies 108, photonic dies 112, and electronic dies 110 face each other ("face-to-face"). For example, the bonding may be, e.g., hybrid bonding, fusion bonding, direct bonding, dielectric bonding, metal bonding, solder joints (e.g., microbumps), or the like.

In some embodiments, the processor dies 106 are bonded to the hybrid interconnect 220 by hybrid bonding. In such embodiments, covalent bonds are formed with oxide layers, such as the dielectric layers 213 and surface dielectric layers (not shown) of the processor dies 106. Before performing the bonding, a surface treatment may be performed on the processor dies 106. Next, a pre-bonding process may be performed, where the processor dies 106 and hybrid interconnect 220 are aligned. The processor dies 106 and hybrid interconnect 220 are pressed against together to form weak bonds in the top of the dielectric layers 213. After the pre-bonding process, the processor dies 106 and hybrid interconnect 220 are annealed to strengthen the weak bonds. During the annealing, OH bonds in the top of the dielectric layers 213 break to form Si—O—Si bonds between the processor dies 106 and hybrid interconnect 220, thereby strengthening the bonds. During the hybrid bonding, metal bonding also occurs between the die connectors 116 of the processor dies 106 and the pads 216 of the hybrid interconnect 220.

In some embodiments, the memory dies 108, photonic dies 112, and electronic dies 110 are bonded to the hybrid interconnect 220 by conductive connectors 222. In such embodiments, the conductive connectors 222 are formed from a conductive material such as solder, copper, aluminum, gold, nickel, silver, palladium, tin, the like, or a combination thereof. In some embodiments, the conductive connectors 222 are formed by initially forming a layer of solder through methods such as evaporation, electroplating, printing, solder transfer, ball placement, or the like. Once a layer of solder has been formed on the structure, a reflow may be performed in order to shape the conductive connectors 222 into desired bump shapes. The conductive connectors 222 form joints between the pads 216 and the die connectors 116 of the memory dies 108, photonic dies 112, and electronic dies 110.

Although the processor dies 106 are illustrated as being bonded to the hybrid interconnect 220 by hybrid bonding and the memory dies 108, photonic dies 112, and electronic dies 110 are illustrated as being bonded to the hybrid interconnect 220 by conductive connectors, it should be appreciated that the dies may be bonded by any technique. For example, all dies may be bonded by hybrid bonding, or all dies may be bonded by conductive connectors. Any combination of bonding types for the various dies may be used. Further, although some of the various dies may be illustrated as being directly adjacent one another, it should be appreciated that the dies may be spaced apart.

The photonic dies 112 are bonded to the hybrid interconnect 220 such that the optical I/O port 118 of each photonic die 112 is disposed along the respective optical transmission path 218. Because the optical transmission paths 218 are substantially free of the conductive features 214, the optical I/O ports 118 have a clear line of sight to the respective grating coupler 206 of the waveguides 204.

In FIGS. 9A and 9B, an underfill 224 may be formed between the hybrid interconnect 220 and dies bonded by the conductive connectors 222 (e.g., the memory dies 108, photonic dies 112, and electronic dies 110). The underfill 224 may be a mold underfill, a polymer underfill, or the like, and may be formed by a capillary flow process after the dies are attached to the hybrid interconnect 220, or may be formed by a suitable deposition method before the dies are attached. The underfill 224 may be opaque for the wavelengths of light used for the optical signals.

Figure 10A:
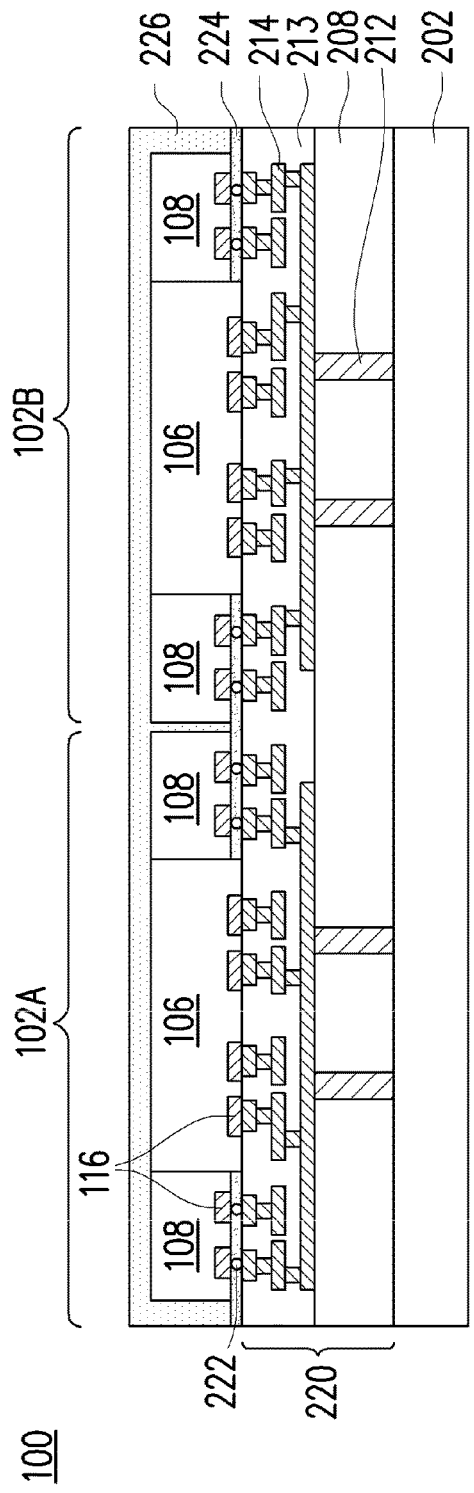
Figure 10B:
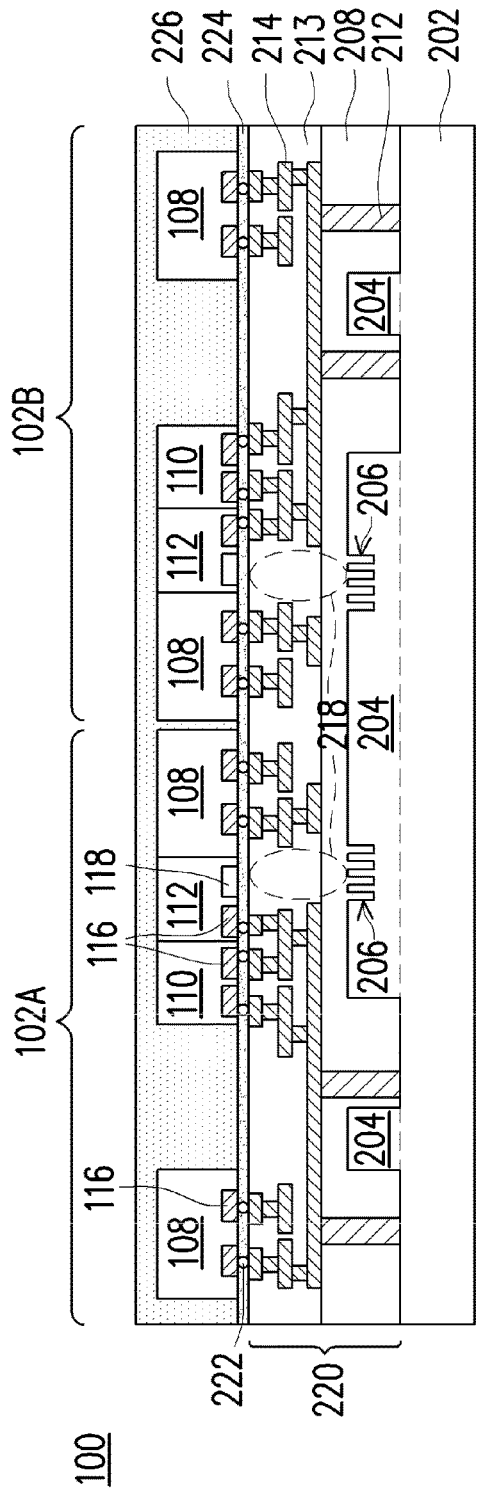

In FIGS. 10A and 10B, an encapsulant 226 is formed on the various components. The encapsulant 226 may be a molding compound, epoxy, or the like, and may be applied by compression molding, transfer molding, or the like. The encapsulant 226 may be formed over the hybrid interconnect 220 such that the processor dies 106, memory dies 108, photonic dies 112, and electronic dies 110 are buried or covered. The encapsulant 226 is then cured. The encapsulant 226 may be planarized, such as by a CMP.

Figure 11A:
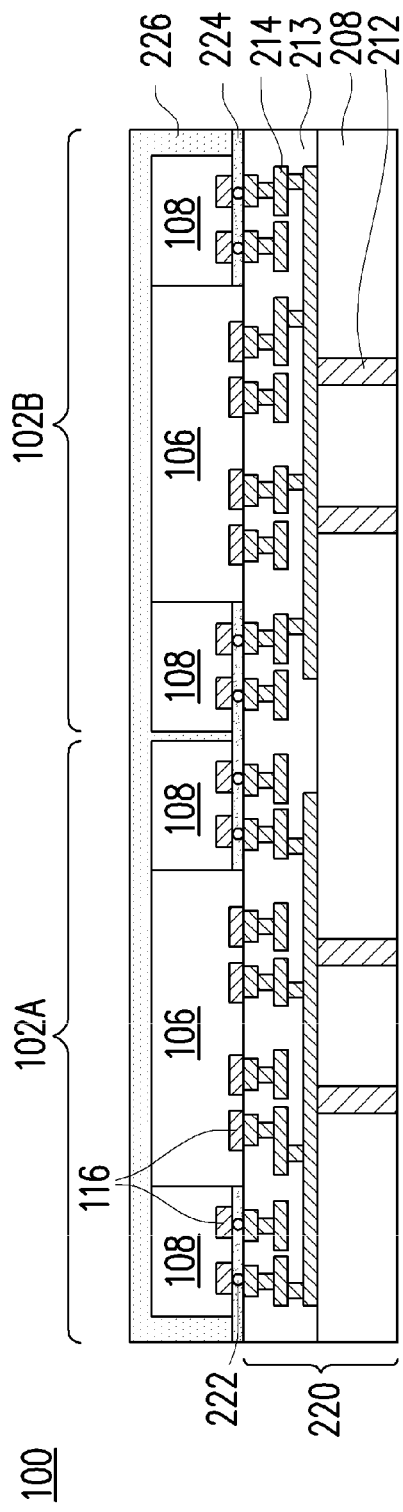
Figure 11B:
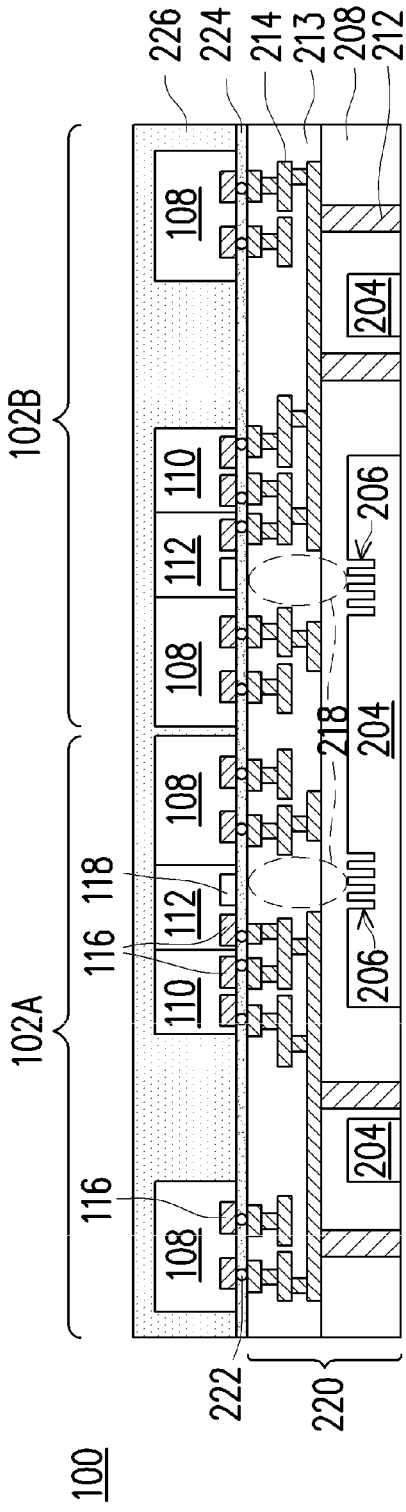

In FIGS. 11A and 11B, the back side of the substrate 202 is thinned to expose the vias 212. The substrate 202 may be thinned by a CMP, a mechanical grinding, or the like. The dielectric layer 208 and/or the conductive material of the vias 212 may have a different removal rate than the material of the substrate 202 such that the dielectric layer 208 and/or vias 212 act as planarization stop layers. After the thinning, the waveguides 204 remain embedded in the dielectric layer 208.

In FIGS. 12A and 12B, conductive pads 228 are formed on the exposed vias 212, the back side of the dielectric layer 208, and the waveguides 204. The conductive pads 228 are electrically connected to the processor dies 106, memory dies 108, photonic dies 112, and electronic dies 110. The conductive pads 228 may be aluminum pads or aluminum-copper pads, although other metallic pads may be used.

A passivation film 230 is formed on the back side of the dielectric layer 208 and waveguides 204, covering the conductive pads 228. The passivation film 230 may be formed from a dielectric material, such as silicon oxide, silicon nitride, the like, or combinations thereof. Openings are formed through the passivation film 230 to expose central portions of the conductive pads 228.

Underbump metallization (UBM) 232 is formed on the conductive pads 228 and passivation film 230. The UBM 232 may be formed by forming a blanket conductive layer on the passivation film 230 and in the openings, such as by electroplating. The conductive layer may be formed from copper, a copper alloy, silver, gold, aluminum, nickel, the like, and combinations thereof. The conductive layer may be patterned to form the UBM 232.

Conductive connectors 234 are formed on the UBM 232. The conductive connectors 234 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 234 may include a conductive material such as solder, copper, aluminum, gold, nickel, silver, palladium, tin, the like, or a combination thereof. In some embodiments, the conductive connectors 234 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 234 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the conductive connectors 234. The metal cap layer may include nickel, tin, tin-lead, gold, silver, palladium, indium, nickel-palladium-gold, nickel-gold, the like, or a combination thereof and may be formed by a plating process.

After formation, the multi-chip systems 100 formed in the wafer may be singulated. Each singulated multi-chip system 100 includes multiple sites 102.

Figure 13:
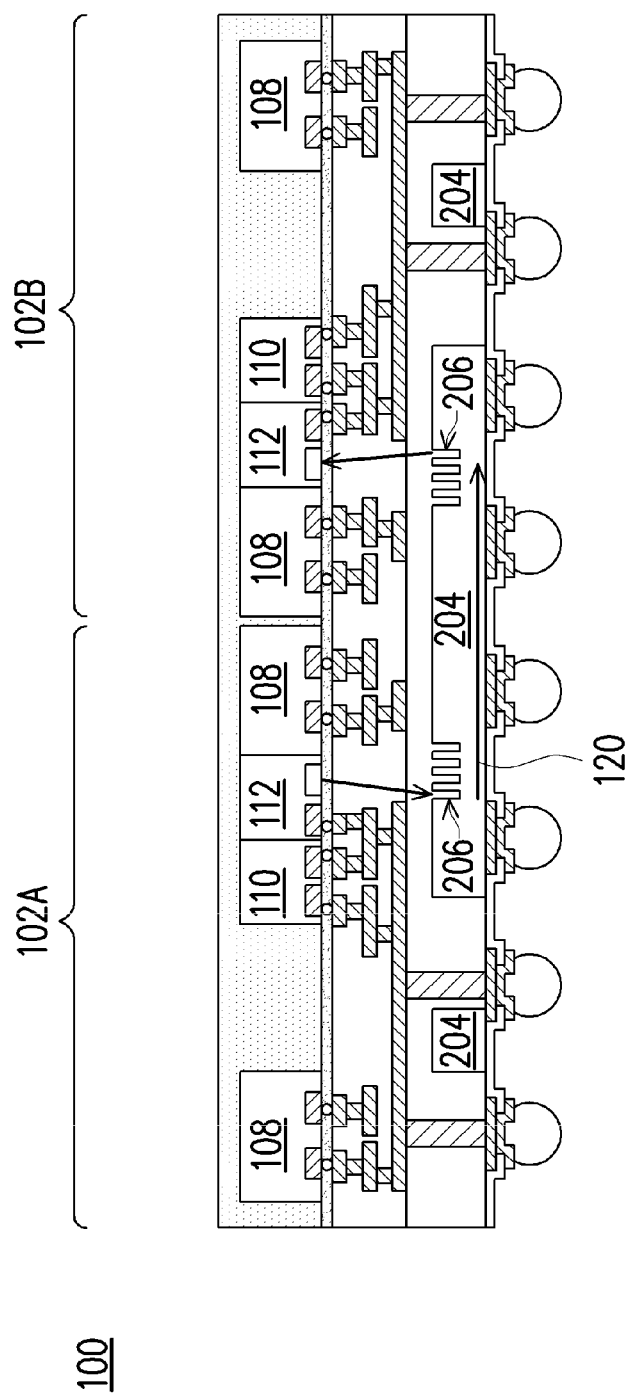
FIG. 13 is a cross-sectional view of the resulting multi-chip system during operation, in accordance with some embodiments.

FIG. 13 is a cross-sectional view of the resulting multi-chip system 100 during operation, in accordance with some embodiments. In particular, transmission of optical signals 120 from the site 102A to the site 102B is illustrated. During transmission, the electronic die 110 controls the photonic die 112 of the transmitting site 102A to modulate the carrier signal according to the electrical signals from the processor die 106 and produce the optical signals 120. The optical signals 120 are transmitted to the waveguides 204. The photonic die 112 of the receiving site 102B receives the optical signals 120 and demodulates them to produce corresponding electrical signals, which are sent to the processor die 106. The optical pathway 104 thus acts as a high-bandwidth and high-density signal routing device that has low latency. In particular, compared to routing signals with through silicon vias (TSVs), the optical pathway 104 may have less signal attenuation at high frequencies, lower crosstalk, and less switching noise.

FIGS. 14A through 24B are various views of intermediate steps during a process for forming the multi-chip system 100, in accordance with some other embodiments. FIGS. 14A through 24B are cross-sectional views, where figures ending with an "A" designation are illustrated along cross-section A-A of FIG. 1B (e.g., along the processor dies 106 and memory dies 108), and figures ending with a "B" designation are illustrated along cross-section B-B of FIG. 1B (e.g., along the memory dies 108, photonic dies 112, and electronic dies 110).

Figure 14A:
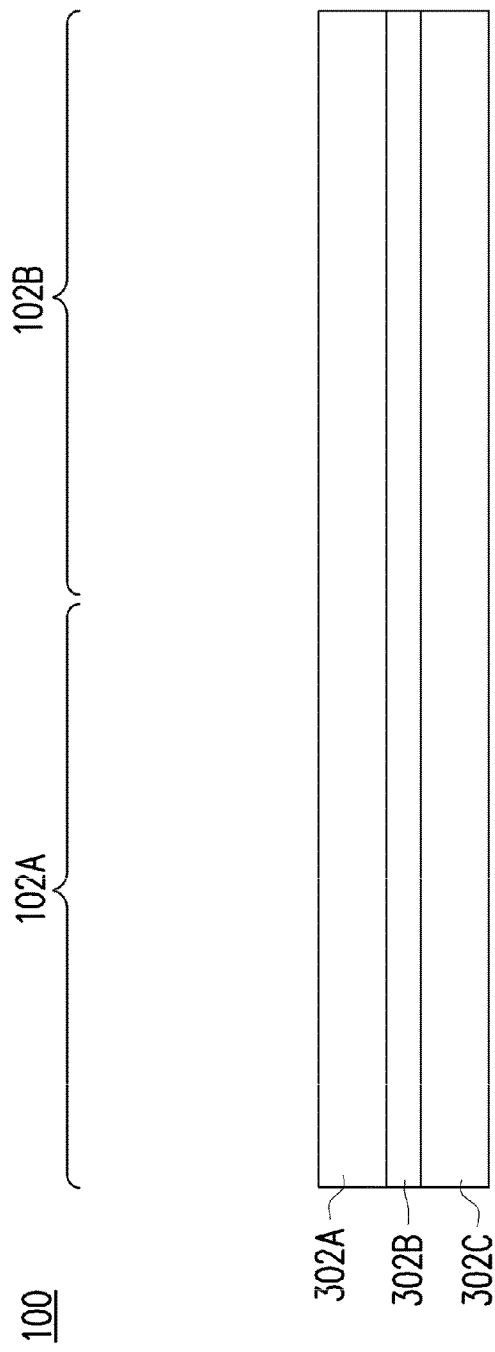
Figure 14B:
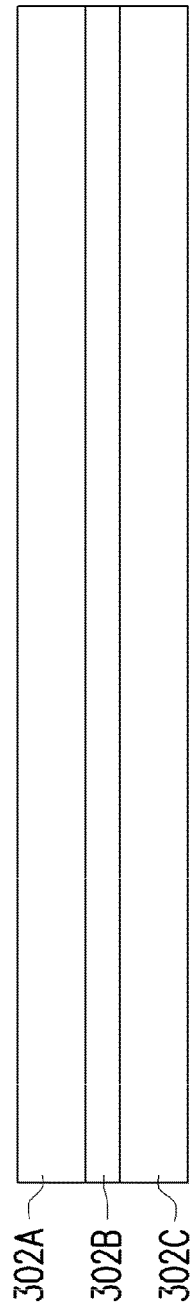

In FIGS. 14A and 14B, a substrate 302 is provided. The substrate 302 is a semiconductor-on-insulator (SOI) substrate, which includes a layer of semiconductor material 302A formed on an insulator layer 302B. The insulator layer 302B may be, for example, a buried oxide (BOX) layer, a silicon oxide layer, or the like. The insulator layer 302B is provided on a semiconductor material 302C, typically a silicon or glass substrate.

In FIGS. 15A and 15B, the front side of the substrate 302 is patterned to form the waveguides 204. Patterning the substrate 302 may be accomplished with acceptable photolithography and etching techniques. In particular, openings are etched in the semiconductor material 302A, and remaining portions of the semiconductor material 302A form the waveguides 204. The insulator layer 302B may act as an etch stop layer for the etching process. The grating couplers 206 are also formed in top portions of the waveguides 204.

In FIGS. 16A and 16B, the dielectric layer 208 is formed on the front side of the substrate 302. In particular, the dielectric layer 208 is formed on the waveguides 204 and insulator layer 302B, in the openings of the semiconductor material 302A defining the waveguides 204, and in the recesses defining the grating couplers 206. In some embodiments, the dielectric layer 208 is the same material as the insulator layer 302B.

Figure 17A:
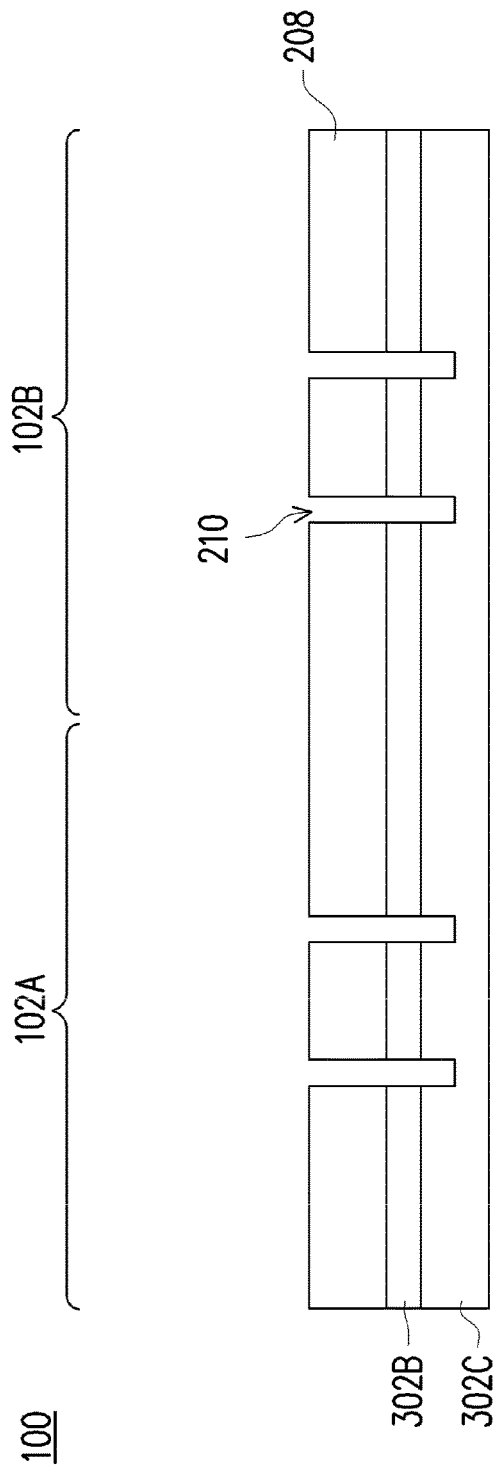
Figure 17B:
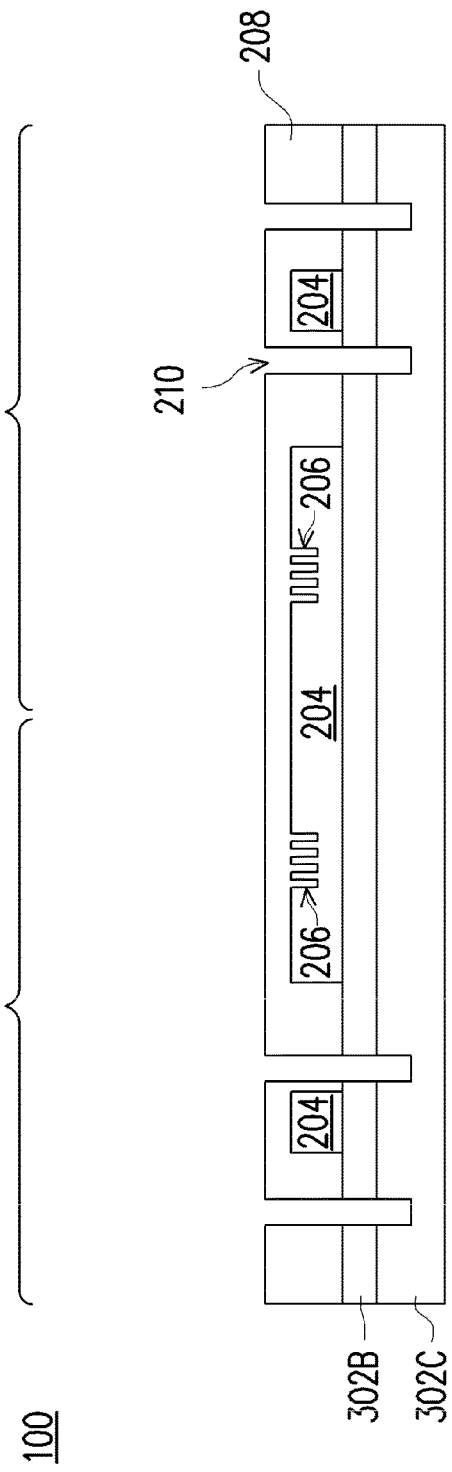

In FIGS. 17A and 17B, the openings 210 are formed. In the embodiment shown, the openings 210 extend through the dielectric layer 208, through the insulator layer 302B, and partially into the semiconductor material 302C. The openings 210 may be formed by acceptable photolithography and etching techniques.

In FIGS. 18A and 18B, a conductive material is formed in the openings 210, thereby forming the vias 212 in the dielectric layer 208. A planarization process, such as a CMP or mechanical grinding may be performed to remove excess conductive material along the top surface of the dielectric layer 208, such that top surfaces of the vias 212 and dielectric layer 208 are level.

Figure 19A:
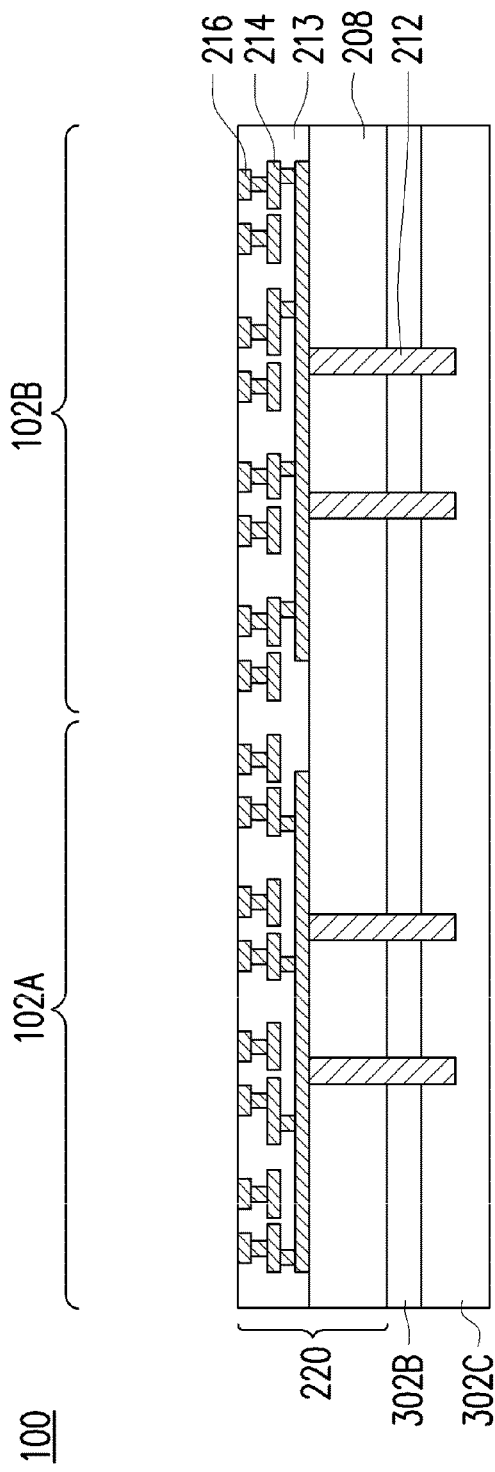
Figure 19B:
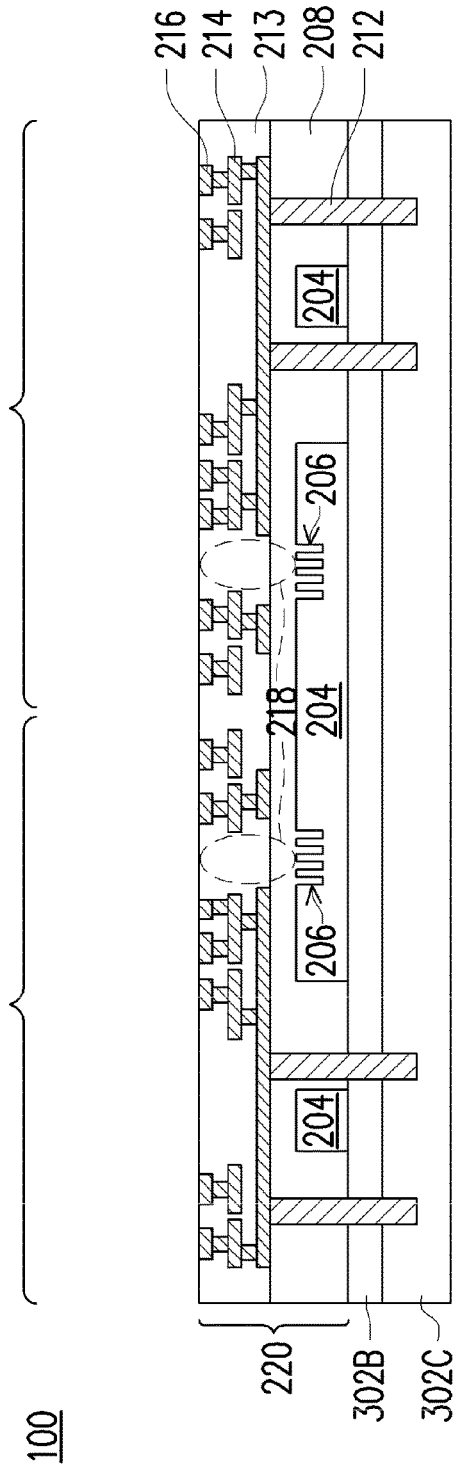

In FIGS. 19A and 19B, the dielectric layers 213 are formed, and the conductive features 214 are formed in the dielectric layers 213. The pads 216 are formed connected to the conductive features 214 in the topmost layer of the dielectric layers 213. Some regions of the dielectric layers 213 are substantially free of the conductive features 214, defining the optical transmission paths 218 for the optical signals. The combination of the waveguides 204, dielectric layer 208, dielectric layers 213, conductive features 214, and pads 216 form the hybrid interconnect 220.

Figure 20A:
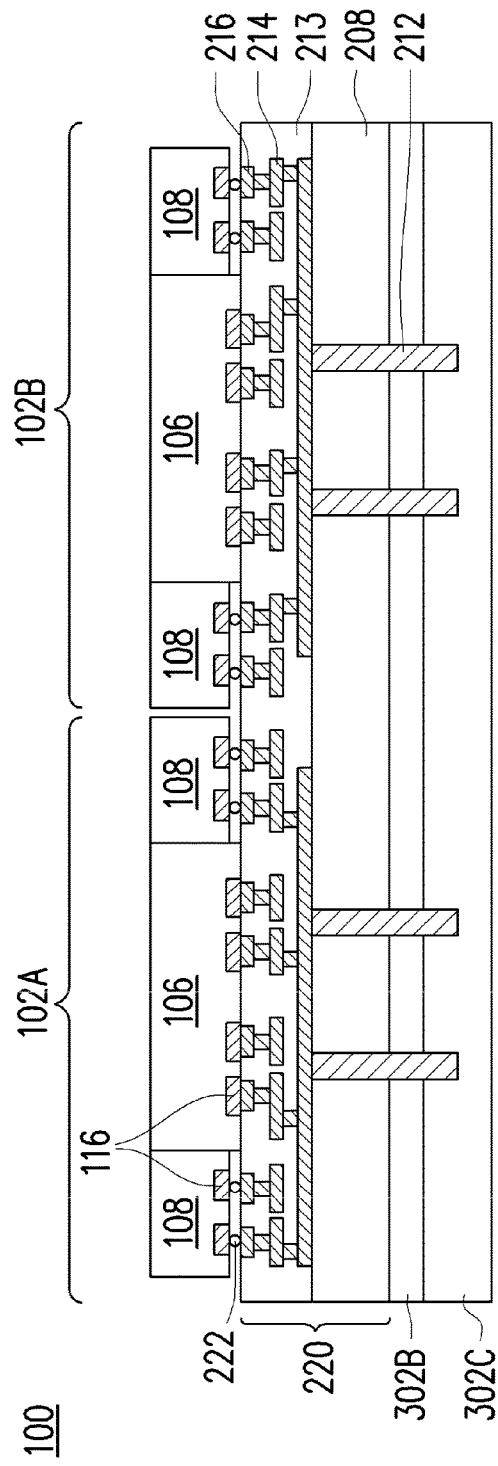
Figure 20B:
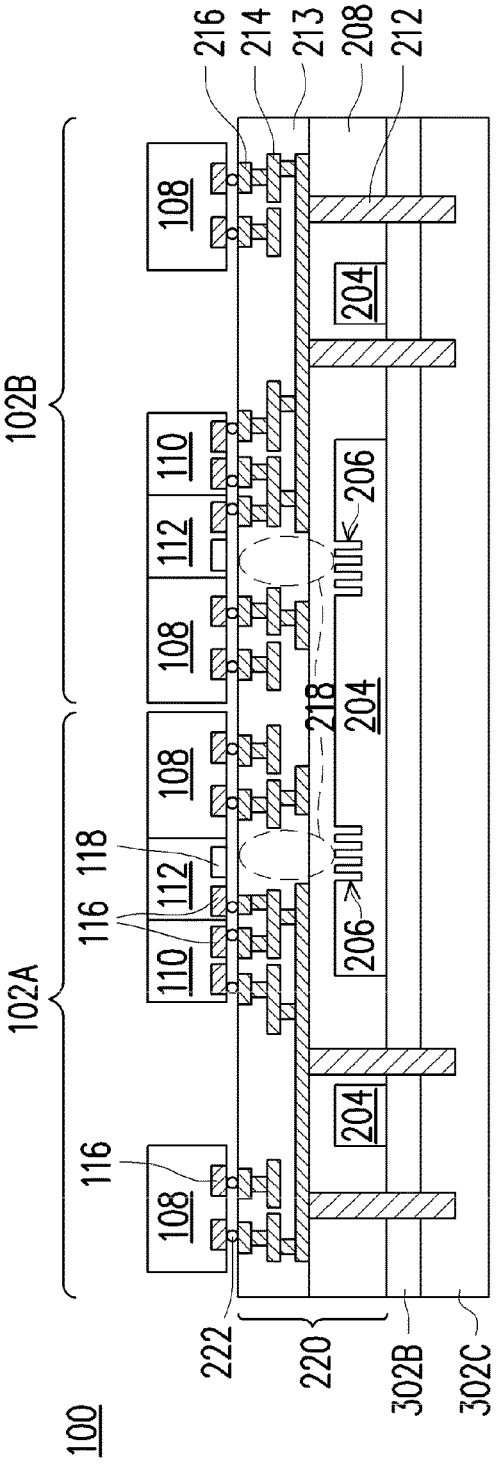

In FIGS. 20A and 20B, the processor dies 106, memory dies 108, photonic dies 112, and electronic dies 110 are attached to hybrid interconnect 220. The various dies are bonded in a face-to-face manner. In some embodiments, the processor dies 106 are bonded to the hybrid interconnect 220 by hybrid bonding, and the memory dies 108, photonic dies 112, and electronic dies 110 are bonded to the hybrid interconnect 220 by conductive connectors 222. The photonic dies 112 are bonded to the hybrid interconnect 220 such that the optical I/O port 118 of each photonic die 112 is disposed along the respective optical transmission path 218.

In FIGS. 21A and 21B, the underfill 224 may be formed between the hybrid interconnect 220 and dies bonded by the conductive connectors 222 (e.g., the memory dies 108, photonic dies 112, and electronic dies 110).

Figure 22A:
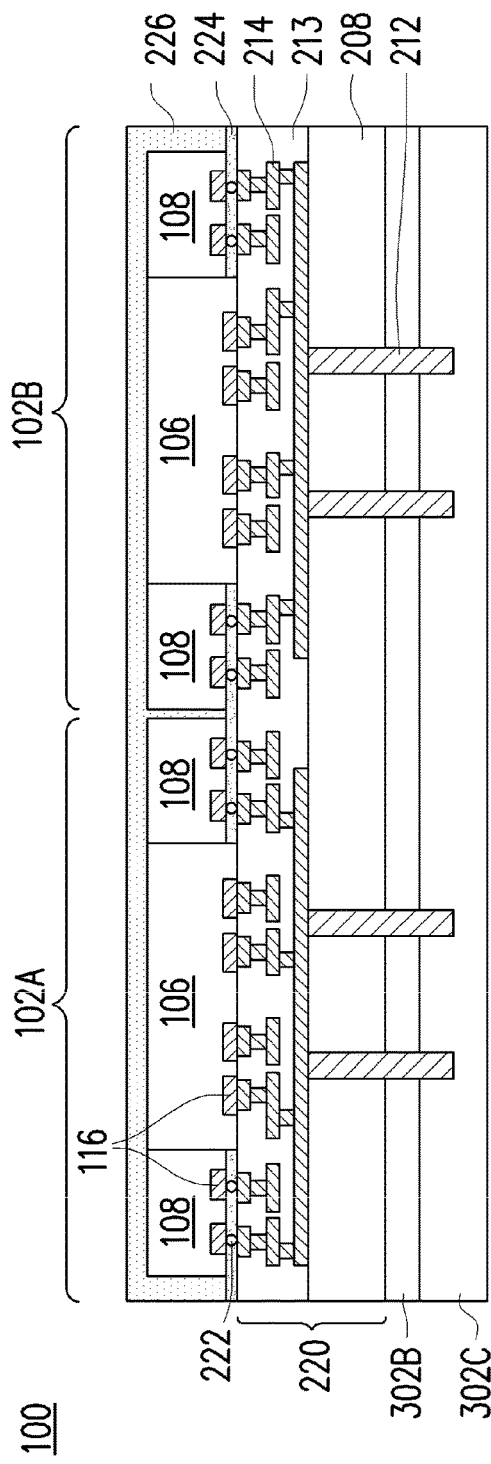
Figure 22B:
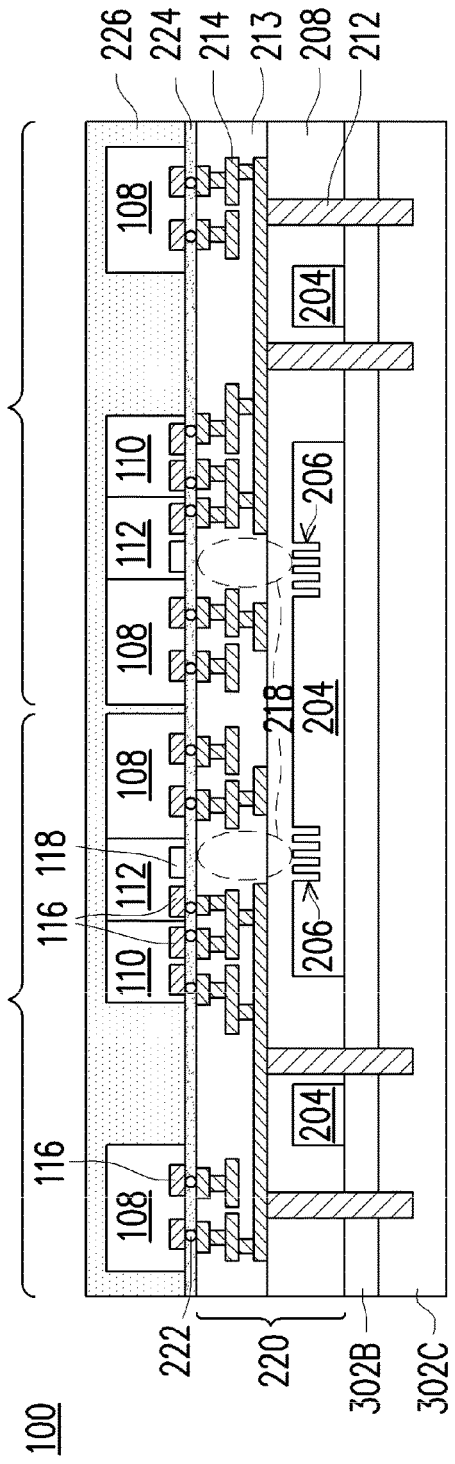

In FIGS. 22A and 22B, the encapsulant 226 is formed on the various components. The encapsulant 226 may be formed over the hybrid interconnect 220 such that the processor dies 106, memory dies 108, photonic dies 112, and electronic dies 110 are buried or covered. The encapsulant 226 is then cured and may be planarized.

In FIGS. 23A and 23B, the back side of the substrate 202 is thinned to expose the vias 212. The substrate 202 is thinned by a thinning process, such as a CMP, a mechanical grinding, or the like, which thins the semiconductor material 302C. The insulator layer 302B acts as a stop layer for the thinning process. In some embodiments, a thin portion of the semiconductor material 302C remains after planarization. After the thinning, the waveguides 204 remain embedded in the dielectric layer 208, and the vias 212 are exposed.

Figures 24A, 24B:
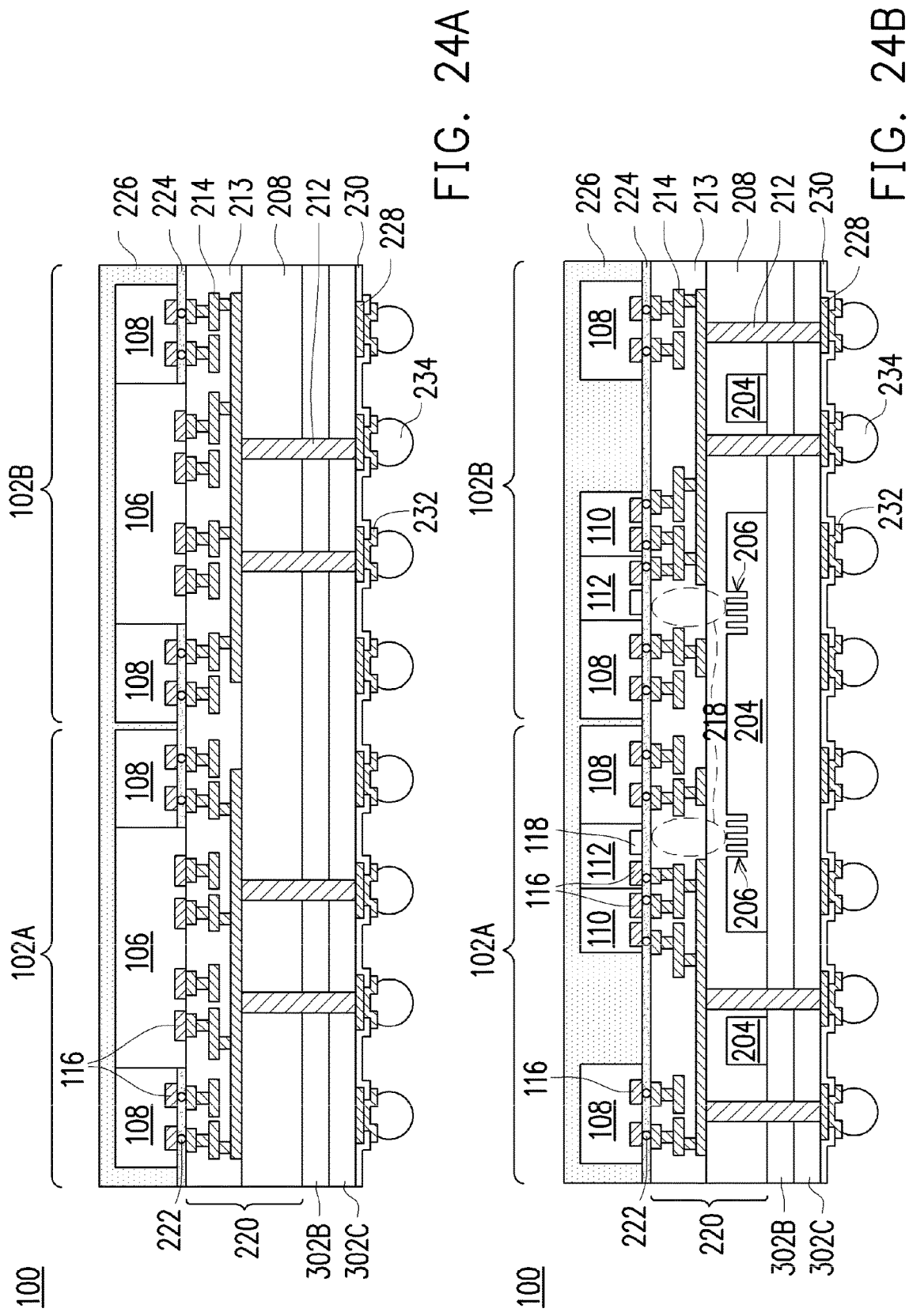

In FIGS. 24A and 24B, the conductive pads 228 are formed on the exposed vias 212, and the back side of the remaining semiconductor material 302C. The passivation film 230 is formed on the conductive pads 228 and the back side of the remaining semiconductor material 302C. Openings are formed through the passivation film 230 to expose central portions of the conductive pads 228. The UBM 232 is formed on the conductive pads 228 and passivation film 230. The conductive connectors 234 are formed on the UBM 232.

After formation, the multi-chip systems 100 formed in the wafer may be singulated. Each singulated multi-chip system 100 includes multiple sites 102.

Figure 25:
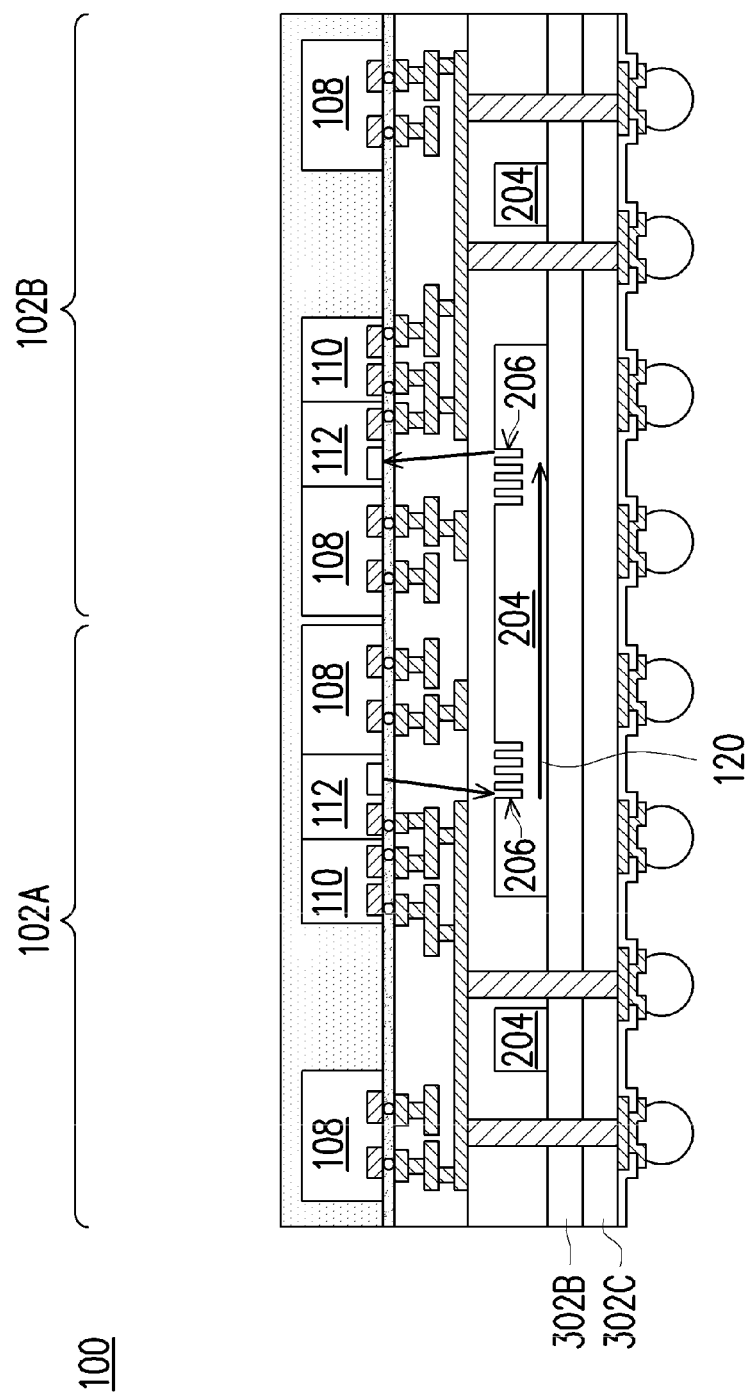
FIG. 25 is a cross-sectional view of the resulting multi-chip system during operation, in accordance with some other embodiments.

FIG. 25 is a cross-sectional view of the resulting multi-chip system 100 during operation, in accordance with some other embodiments. The waveguides 204 are cladded on all sides by materials having a refractive index lower than the refractive index of the material of the waveguides 204. In particular, the waveguides 204 are surrounded by the dielectric layer 208 and insulator layer 302B. As such, the total internal reflectivity of the waveguides 204 may thus be improved.

Embodiments may achieve advantages. Transmitting optical signals in the hybrid interconnect 220 may have less signal attenuation at high frequencies, lower crosstalk, and less switching noise than transmitting electrical signals with TSVs. Optical communication may allow for lower-latency and higher-bandwidth communication between some of the sites 102. The conductive features 214 allow electrical signals to also be transmitted between the sites 102. Allowing both electrical and optical interconnectivity in the same hybrid interconnect 220 may allow increased device performance in, e.g., HPC applications that include many interconnected computer systems.

In an embodiment, an interconnect includes: a first dielectric layer including a first material having a first refractive index, the first dielectric layer having a first surface and a second surface opposite the first surface; a waveguide in the first dielectric layer, the waveguide having a grating coupler defined by recesses in the waveguide, the waveguide including a second material having a second refractive index greater than the first refractive index; a plurality of second dielectric layers on the first surface of the first dielectric layer, the second dielectric layers each including the first material; a plurality of conductive features in the second dielectric layers, the conductive features including conductive lines and vias, an optical transmission path extending from the grating coupler to a top surface of the second dielectric layers being free from the conductive features; a plurality of vias extending through the first dielectric layer; and a plurality of conductive connectors on the second surface of the first dielectric layer, the vias electrically connecting the conductive connectors to the conductive features.

In some embodiments, the first material is silicon and the second material is silicon oxide. In some embodiments, the interconnect further includes: pads in a topmost layer of the second dielectric layers, the pads electrically connected to the vias. In some embodiments, no conductive features are disposed in each of the second dielectric layers along the optical transmission path. In some embodiments, top surfaces of the vias are level with the first surface of the first dielectric layer, and bottom surfaces of the vias are level with the second surface of the first dielectric layer. In some embodiments, a bottom surface of the waveguide is level with the second surface of the first dielectric layer. In some embodiments, the first dielectric layer is on and surrounds and the waveguide. In some embodiments, the first dielectric layer is disposed in the recesses of the waveguide defining the grating coupler. In some embodiments, the interconnect further includes: an insulator layer having a first side and a second side opposite the first side, the waveguide disposed on the first side of the insulator layer, the vias extending through the insulator layer; and a semiconductor material, the semiconductor material disposed on the second side of the insulator layer, the vias extending through the semiconductor material.

In an embodiment, a method includes: patterning a portion of a substrate to form a waveguide, the substrate having a first surface and a second surface opposite the first surface; depositing a first dielectric layer on the waveguide and the first surface of the substrate; forming vias extending through the first dielectric layer; depositing a plurality of second dielectric layers on the first dielectric layer; forming a plurality of conductive features in the second dielectric layers, a first region of the second dielectric layers being free from the conductive features; attaching a plurality of dies to the second dielectric layers, the dies electrically connected to the conductive features, the dies optically connected to the waveguide through the first region of the second dielectric layers; thinning the second surface of the substrate to expose the vias; and forming conductive connectors electrically connected to the vias.

In some embodiments, the substrate is formed of a material having a first refractive index, and the first dielectric layer is formed of a material having a second refractive index less than the first refractive index. In some embodiments, the method further includes: forming a laser source on the substrate, the waveguide extending continuously around the substrate, the laser source optically coupled to the waveguide. In some embodiments, the method further includes: forming recesses in the waveguide to define a grating coupler in the waveguide. In some embodiments, the conductive features are formed in a second region of the second dielectric layers, the first region of the second dielectric layers extending from the grating coupler to a top surface of the second dielectric layers. In some embodiments, the substrate includes a contiguous semiconductor material, and where the patterning the portion of the substrate to form the waveguide includes: forming recesses in the semiconductor material, unrecessed portions of the substrate forming the waveguide. In some embodiments, the substrate includes semiconductor material on an insulator layer, and where the patterning the portion of the substrate to form the waveguide includes: forming openings in the semiconductor material to expose the insulator layer, remaining portions of the semiconductor material forming the waveguide.

In an embodiment, a method includes: forming an interconnect including waveguides and conductive features disposed in a plurality of dielectric layers, the conductive features including conductive lines and vias, the waveguides formed of a first material having a first refractive index, the dielectric layers formed of a second material having a second refractive index less than the first refractive index; bonding a plurality of dies to a first side of the interconnect, the dies electrically connected by the conductive features, the dies optically connected by the waveguides; and forming a plurality of conductive connectors on a second side of the interconnect, the conductive connectors electrically connected to the dies by the conductive features.

In some embodiments, the waveguides include grating couplers, and where the interconnect is substantially free of conductive features in regions extending between the grating couplers of the waveguides and respective photonic integrated circuits. In some embodiments, the bonding the plurality of dies to the first side of the interconnect includes: bonding the plurality of dies to the first side of the interconnect with hybrid bonding. In some embodiments, the bonding the plurality of dies to the first side of the interconnect includes: bonding the plurality of dies to the first side of the interconnect with conductive connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    patterning a portion of a substrate to form a waveguide, the substrate having a first surface and a second surface opposite the first surface;
    depositing a first dielectric layer on the waveguide and the first surface of the substrate;
    forming vias extending through the first dielectric layer;
    depositing a plurality of second dielectric layers on the first dielectric layer;
    forming a plurality of conductive features in the second dielectric layers, a first region of the second dielectric layers being free from the conductive features;
    attaching a plurality of dies to the second dielectric layers, the dies being electrically connected to the conductive features, the dies being optically connected to the waveguide through the first region of the second dielectric layers;
    thinning the second surface of the substrate to expose the vias; and
    forming conductive connectors electrically connected to the vias.

2. The method of claim 1, wherein the substrate is formed of a material having a first refractive index, and the first dielectric layer is formed of a material having a second refractive index less than the first refractive index.

3. The method of claim 1 further comprising:
    forming a laser source on the substrate, the waveguide extending continuously around the substrate, the laser source being optically coupled to the waveguide.

4. The method of claim 1 further comprising:
    forming recesses in the waveguide to define a grating coupler in the waveguide.

5. The method of claim 4, wherein the conductive features are formed in a second region of the second dielectric layers, the first region of the second dielectric layers extending from the grating coupler to a top surface of the second dielectric layers.

6. The method of claim 1, wherein the substrate comprises a contiguous semiconductor material, and wherein the patterning the portion of the substrate to form the waveguide comprises:
    forming recesses in the contiguous semiconductor material, unrecessed portions of the contiguous semiconductor material forming the waveguide.

7. The method of claim 1, wherein the substrate comprises a semiconductor material on an insulator layer, and wherein the patterning the portion of the substrate to form the waveguide comprises:
    forming openings in the semiconductor material to expose the insulator layer, remaining portions of the semiconductor material forming the waveguide.

8. A method comprising:
    depositing a first dielectric layer around waveguides, the waveguides being formed of a first material having a first refractive index, the first dielectric layer being formed of a second material having a second refractive index less than the first refractive index;
    forming a plurality of vias from a first side of the first dielectric layer to a second side of the first dielectric layer;
    depositing a plurality of second dielectric layers on the first side of the first dielectric layer, the second dielectric layers being formed of the second material;
    forming a plurality of conductive features in the second dielectric layers;
    bonding a plurality of dies to the conductive features, the dies being electrically connected by the conductive features, the dies being optically connected by the waveguides; and
    forming a plurality of conductive connectors on the second side of the first dielectric layer, the conductive connectors being electrically connected to the dies by the conductive features and the vias.

9. The method of claim 8, wherein the waveguides comprise grating couplers, and wherein the second dielectric layers are substantially free of conductive features in regions extending between the grating couplers of the waveguides and respective photonic integrated circuits.

10. The method of claim 8, wherein the bonding the plurality of dies to conductive features comprises:

bonding the plurality of dies to the conductive features with hybrid bonding.

11. The method of claim 8, wherein the bonding the plurality of dies to the conductive features comprises:
bonding the plurality of dies to the conductive features with conductive connectors.

12. A method comprising:
depositing a first dielectric layer around a waveguide, the first dielectric layer having a first side and a second side opposite the first side, the waveguide comprising a material having a first refractive index, the first dielectric layer comprising a material having a second refractive index;
forming a plurality of vias extending from the first side of the first dielectric layer to the second side of the first dielectric layer;
depositing a plurality of second dielectric layers adjacent the first side of the first dielectric layer, the second dielectric layers comprising a material having a third refractive index, the second refractive index and the third refractive index being less than the first refractive index;
forming a plurality of first conductive features in first regions of the second dielectric layers, second regions of the second dielectric layers being free from the first conductive features; and
forming a plurality of second conductive features adjacent the second side of the first dielectric layer, the vias electrically connecting the second conductive features to the first conductive features.

13. The method of claim 12 further comprising:
providing a substrate comprising a contiguous semiconductor material; and
forming recesses in the contiguous semiconductor material, unrecessed portions of the contiguous semiconductor material forming the waveguide.

14. The method of claim 13 further comprising:
thinning the substrate such that the second side of the first dielectric layer and a bottom surface of the waveguide are planar.

15. The method of claim 12 further comprising:
providing a substrate comprising a semiconductor material on an insulator layer; and
forming openings in the semiconductor material to expose the insulator layer, remaining portions of the semiconductor material forming the waveguide.

16. The method of claim 15, wherein after forming the vias, the vias further extend through the insulator layer.

17. The method of claim 12 further comprising:
forming recesses in the waveguide to define a grating coupler in the waveguide, the first dielectric layer being further deposited in the recesses.

18. The method of claim 12 further comprising:
attaching a plurality of dies to the second dielectric layers, a first subset of the dies being electrically interconnected by the first conductive features, a second subset of the dies being optically interconnected by the waveguide.

19. The method of claim 18, wherein the first regions of the second dielectric layers are disposed between the first subset of the dies and the waveguide, and wherein the second regions of the second dielectric layers are disposed between the second subset of the dies and the waveguide.

20. The method of claim 18 further comprising:
forming a laser source, the laser source being optically connected to each of the second subset of the dies.

* * * * *